US012769218B2

(12) United States Patent
Park et al.

(10) Patent No.: US 12,769,218 B2
(45) Date of Patent: Oct. 20, 2026

(54) SUBSTRATE PROCESSING APPARATUS

(71) Applicant: SEMES CO., LTD., Cheonan-si (KR)

(72) Inventors: Sang Hyun Park, Yongin-si (KR); Seung Hwan Lee, Cheonan-si (KR); Su Jin Ahn, Suwon-si (KR); Geon Yup Lim, Yongin-si (KR); Jin Ki Shin, Cheonan-si (KR); Dong Hoon Kang, Bucheon-si (KR); Hyun Soo Kim, Cheonan-si (KR); Kwang Soo Kim, Cheonan-si (KR); Chang Suk Oh, Cheonan-si (KR); Young Jun Lee, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 111 days.

(21) Appl. No.: 18/639,022

(22) Filed: Apr. 18, 2024

(65) Prior Publication Data

US 2024/0393705 A1 Nov. 28, 2024

(30) Foreign Application Priority Data

May 25, 2023 (KR) ........................ 10-2023-0067637

(51) Int. Cl.
*G03F 7/00* (2006.01)
*H10P 72/00* (2026.01)

(52) U.S. Cl.
CPC ........ *G03F 7/70975* (2013.01); *G03F 7/7075* (2013.01); *G03F 7/70875* (2013.01);
(Continued)

(58) Field of Classification Search
CPC ............... G03F 7/70975; G03F 7/7075; G03F 7/70875; G03F 7/70733; G03F 7/16;
(Continued)

(56) References Cited

U.S. PATENT DOCUMENTS 5,788,868 A * 8/1998 Itaba ................. H01L 21/67178
156/345.32
6,402,401 B1 * 6/2002 Ueda ................... H01L 21/6715
414/940
(Continued)

FOREIGN PATENT DOCUMENTS

| | | |
|---|---|---|
| KR | 20070029576 A | 3/2007 |
| KR | 20110128766 A | 11/2011 |
| KR | 20140098756 A | 8/2014 |

*Primary Examiner* — Christina A Riddle
(74) *Attorney, Agent, or Firm* — Harness, Dickey & Pierce, P.L.C.

(57) ABSTRACT

Disclosed is a substrate processing apparatus in which weight of a buffer module may be reduced compared to the apparatus in the related art. The substrate processing apparatus may include: an index module; a buffer module; a treating module; and an interface module, in which the index module includes: a load port in which a container receiving a substrate is placed; and an index frame provided with an index robot for transferring the substrate between the container placed in the load port and the buffer module, the buffer module includes a buffer unit on which the substrate is placed, the treating module includes: a cooling chamber for cooling the substrate loaded from the buffer module; a liquid treating chamber for liquid treating the substrate loaded from the cooling chamber; a heat treating chamber for heat treating the substrate loaded from the cooling chamber; and a transfer chamber disposed between the liquid treating chamber and the heat treating chamber, and provided with a transfer robot for transferring the substrate to each of the liquid treating chamber, the heat treating chamber, and the cooling chamber, and when viewed from above, the cooling chamber and the buffer unit are provided in non-overlapping positions.

20 Claims, 15 Drawing Sheets

(52) U.S. Cl.
CPC ...... *H10P 72/0452* (2026.01); *H10P 72/0456* (2026.01); *H10P 72/0458* (2026.01); *H10P 72/0474* (2026.01)

(58) Field of Classification Search
CPC . G03F 7/162; G03F 7/168; G03F 7/40; G03F 7/707; G03F 7/70725; G03F 7/70858; G03F 7/2002; G03F 7/22; G03F 7/26; G03F 7/405; G03F 7/42; G03F 7/708; G03F 7/70808; G03F 7/70991; G03F 7/70483; G03F 7/70491; G03F 7/70866; G03F 7/70908–70941; H01L 21/67173; H01L 21/67225; H01L 21/68707; H01L 21/67109; H01L 21/67178; H01L 21/67742; H01L 21/67161; H01L 21/67098; H01L 21/67207; H01L 21/67103; H01L 21/6715; H01L 21/6719; H01L 21/67017; H01L 21/67196; H01L 21/67248; H01L 21/6838; H01L 21/68742; H01L 21/6875; H01L 21/68764; H01L 21/033; H01L 21/324; H01L 21/67126; H01L 21/67167; H01L 21/67184; H01L 21/67253; H01L 21/67393; H01L 21/67748; H01L 21/68735; H10P 72/00–0618; H10P 72/30–38; H10P 72/76–78; H10P 72/0456; H10P 72/0474; H10P 72/7602; H10P 72/0434; H10P 72/0458; H10P 72/3302; H10P 72/0431; H10P 72/0452; H10P 72/0468; H10P 72/0432; H10P 72/0448
USPC .... 355/18, 27, 30, 52–55, 66–77; 430/5, 22, 430/30
See application file for complete search history.

(56) References Cited

U.S. PATENT DOCUMENTS

| | | | | |
|---|---|---|---|---|
| 2010/0285225 | A1* | 11/2010 | Kaneyama ........ | H01L 21/67225<br>427/372.2 |
| 2016/0035601 | A1* | 2/2016 | Eum ................. | H01L 21/67748<br>432/9 |
| 2019/0378750 | A1* | 12/2019 | Kang ................ | H01L 21/68707 |

* cited by examiner

10

SUBSTRATE PROCESSING APPARATUS

CROSS-REFERENCE TO RELATED APPLICATIONS

This application claims priority to and the benefit of Korean Patent Application No. 10-2023-0067637 filed in the Korean Intellectual Property Office on May 25, 2023, the entire contents of which are incorporated herein by reference.

TECHNICAL FIELD

The present invention relates to a substrate processing apparatus, and more particularly, to a substrate processing apparatus for processing a substrate.

BACKGROUND ART

To manufacture semiconductor devices or flat display panels, various processes, such as deposition, photography, etching, and cleaning, are performed. Among these processes, the photography process includes an application process in which a photosensitive liquid, such as a photoresist, is applied to a surface of a substrate to form a film, an exposure process in which a circuit pattern is transferred to the film formed on the substrate, and a development process in which the film formed on the substrate is selectively removed from the exposed region or an opposite region of the exposed region. Further, a heat treatment process is performed before and after the application process, the exposure process, and the development process.

Among the above processes, the application process, development process, and exposure process are carried out uniformly on a single line as a way to increase the yield of the substrate.

In this case, the substrate is subjected to the application process, the exposure process, and the development process sequentially in a single line of equipment, and the substrate is seated on a cooling unit and cooled in order to dry the substrate during the application process and the development process or to reduce particle deposition.

In general, the cooling unit in the typical application process and development process is often used to seat the substrate for a certain period of time when the substrate is cooled, and in this case, the cooling unit is mainly arranged where the buffer unit for seating the substrate is located. In this case, a transfer mechanism for loading in and out the substrate is installed in a region around the buffer unit.

Therefore, when the cooling unit is placed in the region where the buffer unit and the transfer mechanism are placed, the overall weight of the regions may be more heavily weighted than other regions. As a result, during assembly and transportation of the equipment, the region where the buffer unit is located is subjected to more impact than other regions, which increases the risk of damage to the equipment.

Further, the typical cooling unit is disposed in a vertical region of the buffer unit. Therefore, the transfer mechanism for transferring the substrate mounted in the buffer unit to the cooling unit needs to proceed with the up and down movement drive in the state where the substrate is avoided to a safe position. Therefore, the transfer mechanism repeatedly performs the up and down movement drive and the avoiding drive when transferring the substrate between the buffer unit and the cooling unit, causing a problem of deterioration of the lifespan.

In addition, the typical cooling unit is arranged inside one housing, such as the buffer unit. Therefore, the typical cooling unit has an open periphery of the substrate, which causes a problem that it is difficult to control the moisture of the substrate during cooling to remove the moisture formed on the substrate.

Furthermore, since the typical cooling unit is arranged inside a single housing, such as a buffer unit, the cooling unit is affected by the whole particles entering the housing. As a result, the substrate cooled by the typical cooling unit is affected by the particles in which the buffer unit is located during cooling, resulting in increased defects.

SUMMARY OF THE INVENTION

The present invention has been made in an effort to provide a substrate processing apparatus in which weight of a buffer module may be reduced compared to the apparatus in the related art.

The present invention has also been made in an effort to provide a substrate processing apparatus that is capable of simplifying driving of a transfer mechanism for transferring a substrate mounted on a buffer unit.

The present invention has also been made in an effort to provide a substrate processing apparatus that is capable of easily controlling moisture in a substrate when cooling the substrate being cooled in a cooling chamber.

The present invention has also been made in an effort to provide a substrate processing apparatus that enables impact of external particles to be minimized when cooling the substrate being cooled in the cooling chamber.

The object of the present invention is not limited thereto, and other objects not mentioned will be clearly understood by those of ordinary skill in the art from the following description.

An exemplary embodiment of the present invention provides a substrate processing apparatus may include: an index module; a buffer module; a treating module; and an interface module, in which the index module includes: a load port in which a container receiving a substrate is placed; and an index frame provided with an index robot for transferring the substrate between the container placed in the load port and the buffer module, the buffer module includes a buffer unit on which the substrate is placed, the treating module includes: a cooling chamber for cooling the substrate loaded from the buffer module; a liquid treating chamber for liquid treating the substrate loaded from the cooling chamber; a heat treating chamber for heat treating the substrate loaded from the cooling chamber; and a transfer chamber disposed between the liquid treating chamber and the heat treating chamber, and provided with a transfer robot for transferring the substrate to each of the liquid treating chamber, the heat treating chamber, and the cooling chamber, and when viewed from above, the cooling chamber and the buffer unit are provided in non-overlapping positions.

According to the exemplary embodiment, the interface module may be further provided with the buffer unit and the cooling chamber, and when viewed from above, the buffer unit and the cooling chamber may be provided in non-overlapping positions.

According to the exemplary embodiment, the interface module may further include: two transfer mechanisms disposed oppositely with the buffer unit interposed therebetween; and an interface robot disposed adjacent to the buffer unit, and the cooling chamber may be disposed adjacent to any one of the transfer mechanisms and is disposed adjacent to the interface robot.

According to the exemplary embodiment, the cooling chamber may include: a cooling plate for supporting the substrate; and a housing providing a space in which the cooling plate is accommodated.

According to the exemplary embodiment, in the housing in which the cooling plate is accommodated, a side except for a region where the substrate is loaded and unloaded may be provided in a form of a wall.

According to the exemplary embodiment, the housing in which the cooling plate is accommodated may be provided with an entrance passage for loading and unloading the substrate on a side in a direction facing the transfer robot.

According to the exemplary embodiment, in the housing in which the cooling plate is accommodated, the entrance passages may be formed in areas less than an area of one side of the housing in which the cooling plate is accommodated.

According to the exemplary embodiment, the buffer module may include: the buffer unit; a housing for accommodating the buffer unit; and a transfer mechanism accommodated in the housing and for transferring the substrate from the buffer unit to the cooling chamber, and the housing accommodating the buffer unit may be provided with an entrance passage through which the substrate is loaded in a region in which the transfer mechanism and the cooling chamber are adjacent to each other.

in the housing accommodating the buffer unit, the entrance passages may be formed in areas less than an area of one side of the housing accommodating the buffer unit.

According to the exemplary embodiment, the cooling chamber may be disposed adjacent to the buffer module, and may be disposed adjacent to the transfer chamber.

According to the exemplary embodiment, among sides of the housing in which the cooling plate is accommodated, a side adjacent to the buffer module may be arranged perpendicular to a side adjacent to the transfer chamber.

According to the exemplary embodiment, the transfer mechanism of the buffer module may load the substrate into the cooling chamber, the transfer robot of the transfer chamber may load the substrate loaded into the cooling chamber into the liquid treating chamber or heat treating chamber, and the transfer mechanism of the buffer module may be provided to prevent the substrate in the cooling chamber from being unloaded.

According to the exemplary embodiment, the cooling chamber may form a second negative pressure, and said buffer module may form a third negative pressure lower than said second negative pressure.

According to the exemplary embodiment, said transfer chamber may form a first negative pressure, and said cooling chamber may form a second negative pressure lower than said transfer chamber.

According to the exemplary embodiment, the buffer module may be provided so that a temperature control device for heating or cooling the substrate is not disposed.

According to the exemplary embodiment, the cooling chamber may be disposed adjacent to the transfer chamber, but is disposed on a side of a side of the transfer chamber perpendicular to a longitudinal direction of the transfer chamber among the sides of the transfer chamber.

According to the exemplary embodiment, the cooling chamber may be disposed between the buffer module and the heat treating chamber, or may be disposed between the buffer module and the liquid treating chamber.

Another exemplary embodiment of the present invention provides a substrate processing apparatus including: an index module; a buffer module; a treating module; and an interface module, in which the index module includes: a load port in which a container receiving a substrate is placed; and an index frame provided with an index robot transferring the substrate between the container placed in the load port and the buffer module, the buffer module includes a buffer unit on which the substrate is placed, the treating module further includes: a cooling chamber for cooling the substrate loaded from the buffer module; a liquid treating chamber for liquid treating the substrate loaded from the cooling chamber; a heat treating chamber for heat treating the substrate loaded from the cooling chamber; and a transfer chamber disposed between the liquid treating chamber and the heat treating chamber, and provided with a transfer robot transferring a substrate to each of the liquid treating chamber, the heat treating chamber, and the cooling chamber, and the cooling chamber is disposed adjacent to the transfer chamber, but is disposed on a side of a side of the transfer chamber perpendicular to a longitudinal direction of the transfer chamber among the sides of the transfer chamber.

According to the exemplary embodiment, in the transfer chamber, a region adjacent to the buffer module may be provided in a closed form, and a region adjacent to the cooling chamber may be provided in an open form.

According to the exemplary embodiment, an internal negative pressure of the cooling chamber may be formed higher than an internal negative pressure of the buffer module.

Still another exemplary embodiment of the present invention provides a substrate processing apparatus including: an index module; a buffer module; a treating module; and an interface module, in which the index module includes: a load port in which a container receiving a substrate is placed; and an index frame provided with an index robot for transferring the substrate between the container placed in the load port and the buffer module, the buffer module includes a buffer unit on which the substrate is placed, the treating module further includes: a cooling chamber for cooling the substrate loaded from the buffer module; a liquid treating chamber for liquid treating the substrate loaded from the cooling chamber; a heat treating chamber for heat treating the substrate loaded from the cooling chamber; and a transfer chamber disposed between the liquid treating chamber and the heat treating chamber, and provided with a transfer robot for transferring substrates to each of the liquid treating chamber, the heat treating chamber, and the cooling chamber, and the cooling chamber includes: a cooling plate for supporting the substrate; and a housing providing a space in which the cooling plate is accommodated, the buffer module includes: the buffer unit; a housing for accommodating the buffer unit; and a transfer mechanism accommodated in the housing and for transferring the substrate from the buffer unit to the cooling chamber, and the cooling chamber is arranged adjacent to each of the buffer module and the transport chamber, but is arranged on a side of a side of the transfer chamber perpendicular to a longitudinal direction of the transfer chamber among the sides of the transfer chamber, and the transfer mechanism of the buffer module is provided for loading the substrate into the cooling chamber, and the transfer robot of the transfer chamber is provided for loading the substrate loaded into the cooling chamber into the liquid treating chamber or heat treating chamber, and the transfer mechanism of the buffer module is provided to prevent the substrate in the cooling chamber from being unloaded.

The present invention has the effect of reducing the weight of a buffer module compared to the apparatus in the related art.

Furthermore, the present invention has the effect of simplifying the driving of a transfer mechanism for transferring a substrate mounted on a buffer unit.

Furthermore, the present invention has the effect of easily controlling moisture of a substrate when cooling the substrate being cooled in a cooling chamber.

Furthermore, the present invention has the effect of minimizing the impact of external particles when cooling a substrate cooled in a cooling chamber.

The effect of the present invention is not limited to the foregoing effects, and the not-mentioned effects will be clearly understood by those skilled in the art from the present specification and the accompanying drawings.

BRIEF DESCRIPTION OF THE DRAWINGS

Various features and advantages of the non-limiting exemplary embodiments of the present specification may become apparent upon review of the detailed description in conjunction with the accompanying drawings. The attached drawings are provided for illustrative purposes only and should not be construed to limit the scope of the claims. The accompanying drawings are not considered to be drawn to scale unless explicitly stated. Various dimensions in the drawing may be exaggerated for clarity.

DETAILED DESCRIPTION

Figure 1:
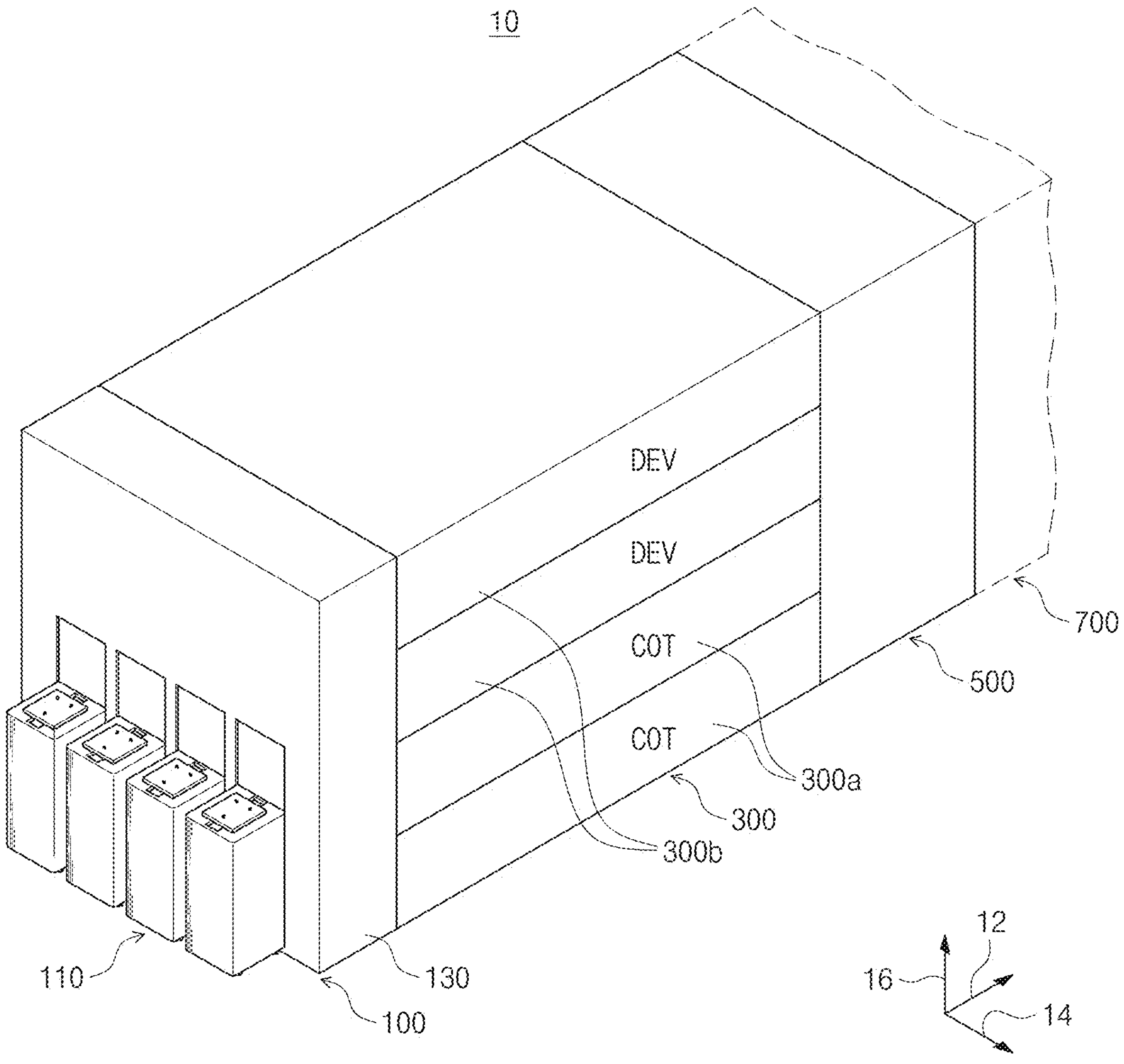
FIG. 1 is a perspective view schematically illustrating a substrate processing apparatus according to an exemplary embodiment of the present invention.

Exemplary embodiments will now be described more fully with reference to the accompanying drawings. The exemplary embodiments are provided in order to make the disclosure exhaustive and will fully convey the scope to one of ordinary skill in the art. To provide a complete understanding of exemplary embodiments of the present invention, a number of specific details are presented, such as examples of certain components, devices, and methods. It will be apparent to those skilled in the art that specific details need not be utilized and that the exemplary embodiments may be implemented in many different forms, neither of which should be construed as limiting the scope of the present invention. In some exemplary embodiments, known processes, known device structures, and known techniques are not described in detail.

The terminology used herein is intended to describe certain exemplary embodiments only and is not intended to limit the exemplary embodiments. Singular expressions, such as those used herein, or expressions where the singular is not specified, are intended to include the plural expressions unless the context clearly indicates otherwise. The terms "includes," "comprising," "including," and "having," have an open-ended meaning and are therefore intended to specify the presence of the features, configurations, integers, steps, operations, elements, and/or components mentioned and do not exclude the presence or addition of one or more other features, configurations, steps, operations, elements, components, and/or groups thereof. The method steps, processes, and operations described herein are not to be construed as necessarily being performed in the particular order in which they are discussed or described, unless the order in which they are performed is specified. In addition, additional or alternative steps may be selected.

When an element or layer is referred to as being "on," "connected to," "bonded to," "attached to," "adjacent to," or "covering" another element or layer, the element or layer may be directly on, connected to, bonded to, attached to, adjacent to, or covering the other element or layer, or intermediate elements or layers may be present. Conversely, when an element is referred to as being "directly on," "directly connected to," or "directly bonded to" another element or layer, it is to be understood that no intervening elements or layers are present. Throughout the specification, the same reference numeral refers to the same element. As used in the present invention, the term "and/or" includes all combinations and sub-combinations of one or more of the enumerated items.

Although terms, such as first, second, and third, may be used to describe various elements, regions, layers, and/or sections of the present invention, it is to be understood that these elements, regions, layers, and/or sections are not to be limited by these terms. These terms are used to distinguish one element, region, layer, or section from another element, region, layer, or section only. Accordingly, the first element, first region, first floor, or first section discussed below may be referred to as the second element, second region, second floor, or second section without departing from the teachings of the exemplary embodiments.

Spatially relative terms (for example, "beneath," "underneath," "below," "on," "above," and "on top,") may be used for ease of description to describe the relationship of one element or feature to another element(s) or feature(s) as illustrated in the drawings. It is to be understood that spatially relative terms are intended to include not only the orientations illustrated in the drawings, but also other orientations of the apparatus in use or operation. For example, when the device in the drawing is flipped, the elements described as "underneath" or "below" other elements or features may be oriented "above" other elements or features.

Thus, the term "below" above may include both up and down orientations. The apparatus may be oriented differently (rotated 90 degrees, or otherwise oriented), and the spatially relative descriptive phrases used in the present invention may be construed accordingly.

It should be understood that when the terms "same" or "equal" are used in the description of exemplary embodiments, some imprecision may exist. Therefore, when an element or value is referred to as being equal to another element or value, it should be understood that the element or value is equal to the other element or value within a manufacturing or operating error (for example, 10%).

When the words "approximately" or "substantially" are used herein with respect to a figure, such figure is to be understood to include a manufacturing or operating error (for example, 10%) of the stated figure. It should also be understood that the use of the words "generally" and "substantially" in reference to geometric shapes does not require geometric shape accuracy, but latitude for shape is within the scope of the disclosure.

Unless otherwise defined, all terms used in the present invention, including technical and scientific terms, have the same meaning as commonly understood by one of ordinary skill in the art to which the exemplary embodiments belong. It is also to be understood that terms, including commonly used dictionary-defined terms, are to be interpreted to have a meaning consistent with their meaning in the context of the relevant art and are not to be construed in an idealized or overly formal sense unless expressly defined in the present invention.

In the present exemplary embodiment, a wafer will be described as an example of an object to be treated. However, the technical spirit of the present invention may be applied to devices used for other types of substrate treatment, in addition to wafers.

Hereinafter, exemplary embodiments of the present invention will be described with reference to the accompanying drawings.

Figure 2:
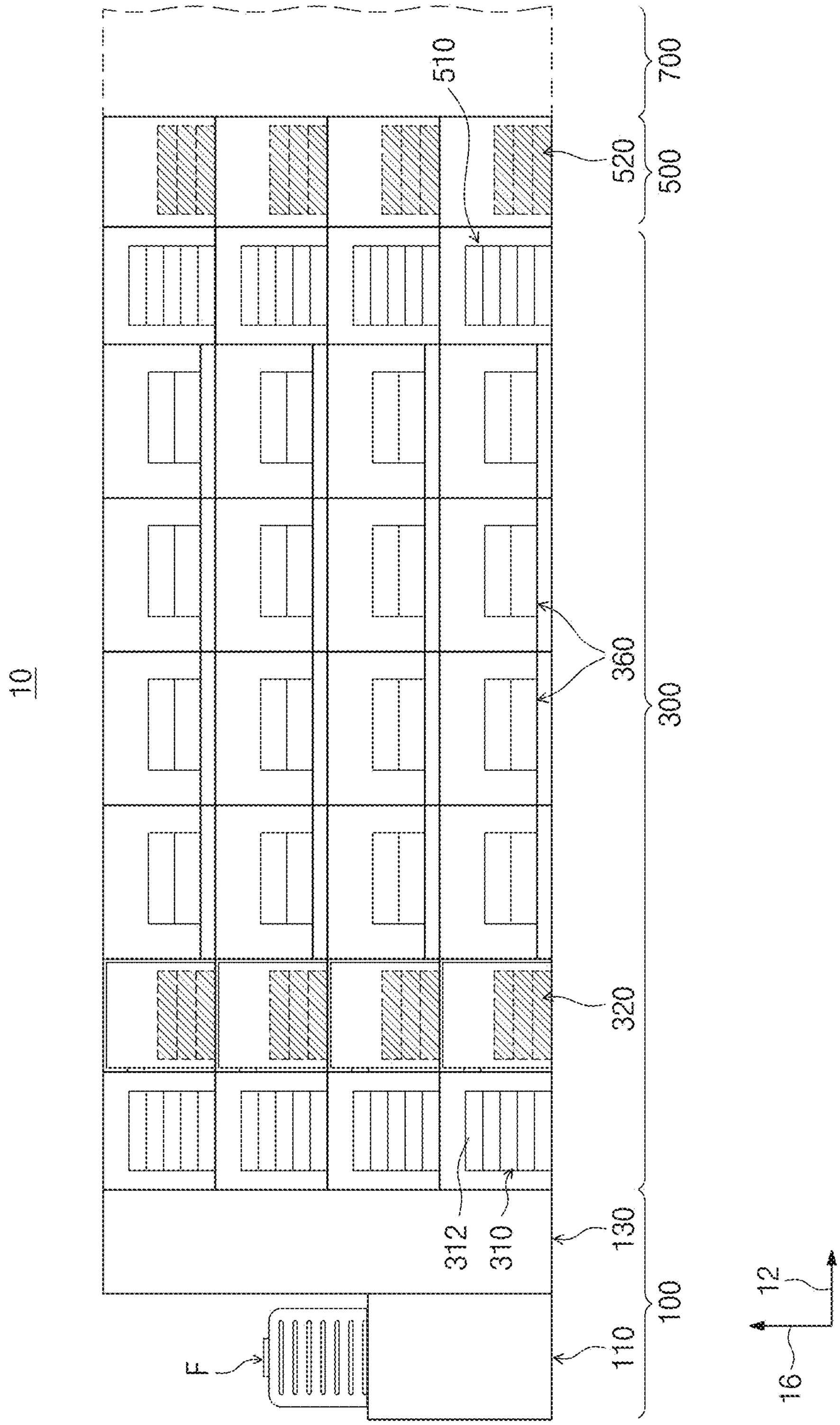
FIG. 2 is a front view of the substrate processing apparatus of FIG. 1.
Figure 3:
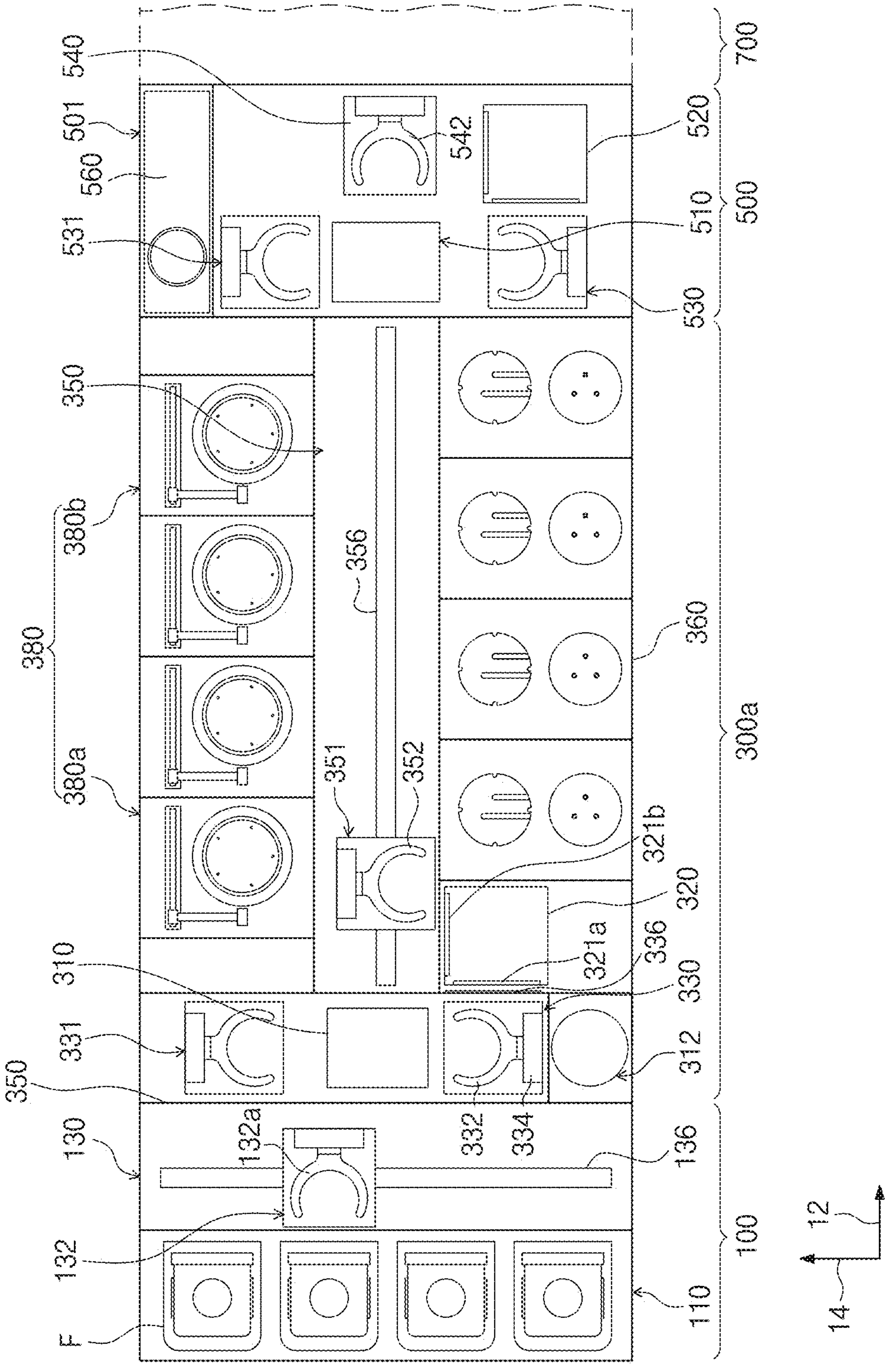
FIG. 3 is a top plan view of an applying block in the substrate processing apparatus of FIG. 1.
Figure 4:
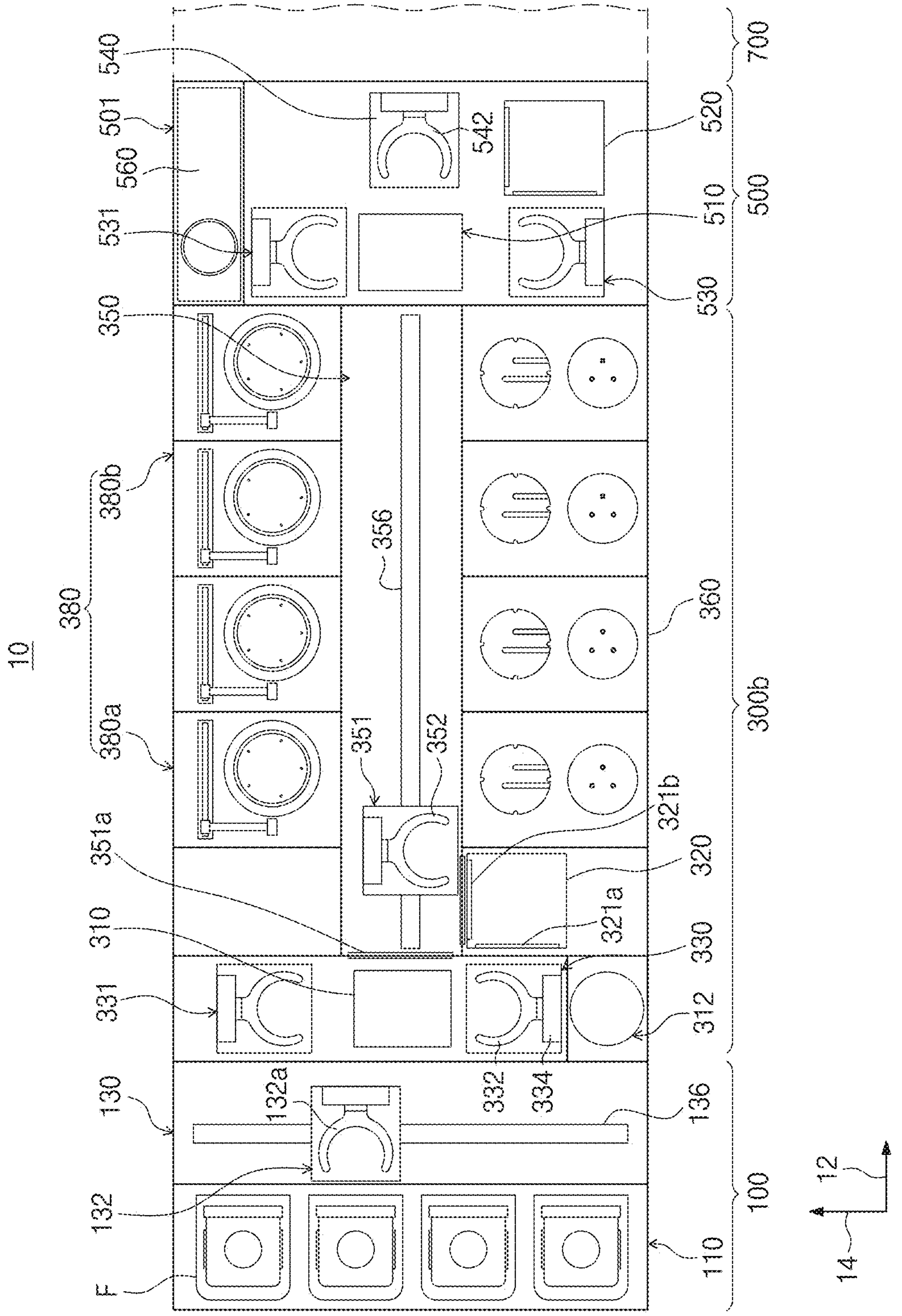
FIG. 4 is a top plan view of a developing block in the substrate processing apparatus of FIG. 1.
Figure 5:
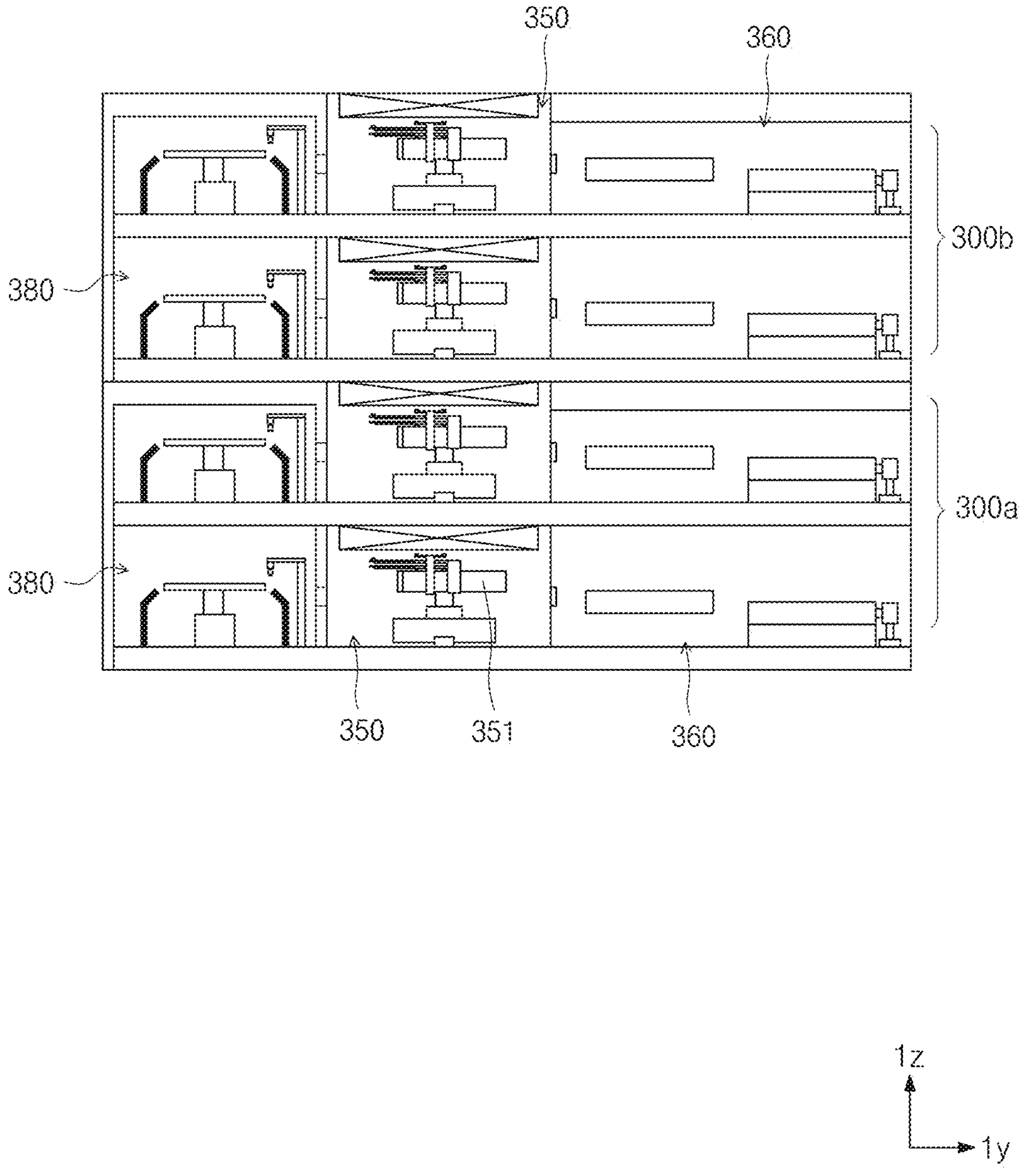
FIG. 5 is a longitudinal cross-sectional view of the substrate processing apparatus of FIG. 1 viewed in a side direction.

FIG. 1 is a perspective view schematically illustrating a substrate processing apparatus according to an exemplary embodiment of the present invention, and FIG. 2 is a front view of the substrate processing apparatus of FIG. 1. FIG. 3 is a top plan view of an applying block in the substrate processing apparatus of FIG. 1, and FIG. 4 is a top plan view of a developing block in the substrate processing apparatus of FIG. 1. FIG. 5 is a longitudinal cross-sectional view of the substrate processing apparatus of FIG. 1 viewed in a side direction.

Referring to FIGS. 1 to 5, a substrate processing apparatus 10 includes an index module 100, a treating module 300, and an interface module 500. According to the exemplary embodiment, the index module 100, the treating module 300, and the interface module 500 are sequentially arranged in a row. Hereinafter, a direction in which the index module 100, the treating module 300, and the interface module 500 are arranged is defined as a first direction 12, a direction perpendicular to the first direction 12 when viewed from above is defined as a second direction 14, and a direction perpendicular to both the first direction 12 and the second direction 14 is defined as a third direction 16.

The index module 100 is provided for transferring a substrate W between a container F in which the substrate W is accommodated and the treating module 300. A longitudinal direction of the index module 100 is provided in the second direction 14. The index module 100 includes a load port 110 and an index frame 130. The container F in which the substrates W are accommodated is placed on the load port 110. The load port 110 is located on the opposite side of the treating module 300 relative to the index frame 130. A plurality of load ports 110 may be provided, and the plurality of load ports 110 may be disposed along the second direction 14.

In an example, as the container F, an airtight container F, such as a Front Open Unified Pod (FOUP), may be used. The container F may be placed on the load port 110 by a transfer means (not illustrated), such as an overhead transfer, an overhead conveyor, or an automatic guided vehicle, or an operator.

An index robot 132 is provided inside the index frame 130. Within the index frame 130, a guide rail 136 is provided. A longitudinal direction of the guide rail 136 is provided in the second direction 14. The index robot 132 is mounted on the guide rail 136 so as to be movable along the guide rail 136. The index robot 132 includes a hand **132*a* on which the substrate W is placed. The hand 132*a* may be provided to be movable forwardly and backwardly, movable linearly along the third direction, and rotatably movable about the axis of the third direction 16**.

The treating module 300 performs an application process and a development process on the substrate W. The treating module 300 includes a coating block **300*a* and a developing block 300*b***.

The applying block **300*a* performs an application process on the substrate W before the exposure process. The developing block 300*b* performs a development process on the substrate W after the exposure process. A plurality of applying blocks 300*a* is provided. The plurality of applying blocks 300*a* may be provided while being stacked on top of each other. A plurality of developing blocks 300*b* is provided. The plurality of developing blocks 300*b* may be provided to be stacked with each other. In one example, two applying blocks 300*a* are provided and two developing blocks 300*b* are provided. The plurality of applying blocks 300*a* may be positioned below the developing blocks 300*b***.

In one example, the plurality of applying blocks **300*a* may be provided with structures that are identical to each other. A film applied to the substrate W in each of the plurality of applying blocks 300*a* may be the same type of film. Optionally, the films applied to the substrate W by each applying block 300*a*** may be different types of films. The film applied to the substrate W includes a photoresist film. The film applied to the substrate W may further include an anti-reflective film. Optionally, the film applied to the substrate W may further include a protective film.

Additionally, the two developing blocks **300*b* may be provided with the same structures as each other. A developer supplied to the substrate W in the plurality of developing blocks 300*b* may be the same type of liquid. Optionally, the developer supplied to the substrate W may be different types of developer depending on the developing blocks 300*b*. For example, a process for removing a light-irradiated region in a region of a register film on the substrate W may be performed in one of the two developing blocks 300*b*, and a process for removing a non-irradiated region may be performed in the other of the two developing blocks 300*b***.

Referring to FIG. 3, the applying block **300*a* includes a buffer unit 310, a hydrophobization chamber 312, a cooling chamber 320, a transfer chamber 350, a heat treating chamber 360, and a liquid treating chamber 380**.

The buffer unit 310, the hydrophobization chamber 312, and the cooling chamber 320 are disposed adjacent to the index block 100. The hydrophobization chamber 312 and the buffer unit 310 may be sequentially disposed along the second direction 14. Further, the cooling chamber 312 and the buffer unit 310 may be provided to be stacked on top of each other in an upward and downward direction.

The buffer unit 310 includes one or a plurality of buffers 312. When a plurality of buffers 312 is provided, the plurality of buffers 312 may be arranged to be stacked on top of each other. The buffer 312 provides a space for the substrate W to stay when the substrate W is transferred between the index module 100 and the treating module 300. The hydrophobization chamber 312 provides a hydrophobization treatment to the surface of the substrate W. The hydrophobization treatment may be performed prior to performing an application process on the substrate W. The hydrophobization treatment may be accomplished by supplying hydrophobizing gas to the substrate W while heating the substrate W.

A transfer mechanism 330 is provided between the hydrophobization chamber 312 and the buffer unit 310 and between the hydrophobization chamber 312 and the cooling chamber 320. The transfer mechanism 330 is provided for transferring the substrate W between the buffer unit 310, the hydrophobization chamber 312, and the cooling chamber 320.

The transfer mechanism 330 includes a hand 332 on which the substrate W is placed, and the hand 332 may be provided to be movable forwardly and backwardly, rotatable about the third direction 16, and movable along the third direction 16. In one example, the transfer mechanism 330 is moved in the third direction 16 along a guide rail 334. The guide rail 334 extends from an applying block located at the lowest of the applying blocks **300*a* to a developing block located at the highest of the developing blocks 300*b*. This allows the transfer mechanism 330 to transfer the substrate W between the blocks 300*a* and 300*b* provided on different layers. For example, the transfer mechanism 330 may transfer the substrate W between the applying blocks 300*a* and 300*b* provided on different layers. The transfer mechanism 330 may also transfer the substrate W between the applying block 300*a* and the developing block 300*b***.

Further, the transfer mechanism 330 is provided to load the substrate W into the cooling chamber 320, but not to unload the substrate W from the cooling chamber 320. Thus, the transfer mechanism 330 improves the transfer efficiency of the substrate W because the process of unloading the substrate W from the cooling chamber 320 is omitted.

In addition, another transfer unit 331 may be further provided on the opposite side of the side where the hydrophobization chamber 312 is provided relative to the buffer unit 310. Another transfer unit 331 may be provided to transfer the substrate W between the buffer unit 310 and the cooling unit 320 provided in the same block **300*a* and 300*b*. Further, another transfer unit 331 may be provided to transfer the substrate W between the buffer unit 310 and the cooling unit 320 provided in different blocks 300*a* and 300*b***.

Further, the buffer unit 310 and the transfer mechanisms 330 and 331 are accommodated in a space within the housing 350. The housing 350 is schematically formed in a cuboidal shape. The housing 350 is formed with entrance passages 336 for the substrate W to be loaded and unloaded on sides adjacent to the index frame 130 and the transfer chamber 350, respectively. The housing 350 has the entrance passage 336 formed on the side adjacent to the cooling chamber 320 through which the substrate W is loaded and unloaded. In this case, the entrance passage may be configured with a shutter (not illustrated). The shutter may be opened when the substrate W is loaded into the cooling chamber 320 from the transfer mechanism 330 and closed when the substrate W is not loaded in.

Furthermore, the housing 350 in which the buffer unit 310 is accommodated may cause the internal airflow to flow in the exhaust direction by the intake of an exhaust line that exhausts the internal airflow. In this case, particles inside the housing 350 may flow through the exhaust line. Furthermore, the housing 350 accommodating the buffer unit 310 and the transfer mechanisms 330 and 331 has an internal pressure set to a third negative pressure by the exhaust, and the third negative pressure forms a negative pressure lower than the second negative pressure in the cooling chamber 320. Thus, the particles inside the housing 350 accommodating the buffer unit 310 and the transfer mechanisms 330 and 331 may be prevented from being introduced into the cooling chamber 320, so that the yield of the substrate W may be improved.

Further, the housing 350 accommodating the buffer unit 310 and the transfer mechanisms 330 and 331 is formed such that the housing 350 is not equipped with a temperature control device to adjust the temperature. For example, the housing 350 is formed such that the interior of the housing 350 is not equipped with a device for heating the substrate W or cooling the substrate W. Thus, the housing 350 accommodating the buffer unit 310 and the transfer mechanism 330 and 331 may ensure that the third negative pressure does not become higher than the second negative pressure or does not change.

Further, the housing 350, the buffer unit 310, and the transfer mechanisms 330 and 331 may be configured in the form of a single buffer module. Thus, a buffer module may include the housing 350, the buffer unit 310, and the transfer mechanisms 330 and 331. The buffer module may be compartmentalized from other modules so that airflow within the buffer module is controlled to form the third negative pressure described above.

The cooling chamber 320 cools the substrate W. The cooling chamber 320 may have one or a plurality of cooling plates. When a plurality of cooling plates is provided, the plurality of cooling plates may be arranged to be stacked on top of each other. The cooling plate may have a flow path through which coolant flows. The cooling chamber 320 may receive the hydrophobized substrate W in the hydrophobization chamber 312 from the transfer mechanism 330, and may cool the received substrate W. Additionally, the cooling chamber 320 may receive the heat-treated substrate W from the transfer robot 351 and cool the received substrate W. The cooling chamber 320 may utilize a water cooling method that sprays a cooling liquid directly onto the substrate W, or a thermal conductive cooling method that conducts cold air. Additionally, the cooling chambers 320 may be stacked with each other, and in this case, the cooling chambers 320 may include a greater number than the number illustrated in the drawings.

Furthermore, the cooling chamber 320 is not disposed within the housing 350 in which the buffer unit 310 is located. Further, the cooling chamber 320 is disposed such that the cooling chamber 320 does not overlap with the buffer unit 310 when viewed from above. Thus, the region where the buffer unit 310 is disposed is not disposed with the cooling chamber 320, thus eliminating the problem of weight bias as in the related art.

Furthermore, because the cooling chamber 320 is enclosed by a housing 321 separate from the housing 350 in which the buffer unit 310 is located, the cooling chamber 320 may cool the substrate W to facilitate control of moisture formed on the substrate W.

Furthermore, the cooling chamber 320 is enclosed by a housing 321 separate from the housing 350 in which the buffer unit 310 is located, so that the airflow is controlled independently of the housing 350 in which the buffer unit 310 is located. Thus, the cooling chamber 320 may increase the yield of the substrate W, as the effect of particles introduced from the vicinity of the buffer unit 310 is minimized during cooling of the substrate W.

Further, the cooling chamber 320 may be disposed adjacent to the transfer chamber 350, but may be disposed on a side of the transfer chamber 350 that is perpendicular to the longitudinal direction of the transfer chamber 350 among the sides of the transfer chamber 350. Thus, the transfer robot 351 has a simplified drive and movement path when transferring the substrate in the cooling chamber 320, which increases lifespan and shortens the processing time of the substrate W. In this case, in order to simplify the movement path of the transfer robot 351, the cooling chamber 320 may be disposed between the buffer module and the heat treating chamber 360 while being disposed on the longitudinal and perpendicular side of the transfer chamber 350 among the four sides of the transfer chamber 350.

The transfer chamber 350 is provided so that a longitudinal direction thereof is parallel to the first direction 12. One end of the transfer chamber 350 may be positioned adjacent to the buffer unit 310. The other end of the transfer chamber 350 may be positioned adjacent to the interface module 500.

Further, the transfer chamber 350 may be set to a first negative pressure, which is a pressure higher than that of the housing 350 accommodating the buffer unit 310 and the transfer mechanisms 330 and 331. Thus, the internal airflow of the transfer chamber 350 is directed to flow toward the side of the housing 350 accommodating the buffer unit 310 and the transfer mechanisms 330 and 331 so that the substrate W that has undergone heat treatment and liquid treatment is not affected by external particles when transferring the substrate W.

Further, the transfer chamber 350 disposed in the applying block 300*a* is formed in such a way that the region adjacent to the buffer unit 310 is closed. Thus, the transfer chamber 350 disposed in the applying block 300*a* is formed in such a way that the internal airflow does not flow directly to the buffer unit 310 side, so that particles on the buffer unit 310 side do not flow to the transfer chamber 350 side.

A plurality of heat treating chambers 360 is provided. Some of the heat treating chambers 360 is disposed along the first direction 12. Additionally, some of the heat treating chambers 360 may be stacked along the third direction 16. The heat treating chambers 360 may all be located on one side of the transfer chamber 350.

The liquid treating chamber 380 performs a liquid film formation process to form a liquid film on the substrate W. In one example, the liquid film forming process includes a resist film forming process. The liquid film forming process may include an anti-reflective film forming process. Optionally, the liquid film forming process may further include a protective film forming process. A plurality of liquid treating chambers 380 is provided. The liquid treating chambers 380 may be located on opposite sides of the heat treating chamber 360. For example, all of the liquid treating chambers 380 may be located on the other side of the transfer chamber 350. The liquid treating chambers 380 are arranged side-by-side along the first direction 12. Optionally, some of the liquid treating chambers 360 may be stacked along the third direction 16.

In one example, the liquid treating chambers 380 include a front end liquid treating chamber 380*a* and a rear end liquid treating chamber 380*b*. The front end liquid treating chamber 380*a* is disposed relatively close to the index module 100, and the rear end liquid treating chamber 380*b* is disposed further close to the interface module 500.

The front end liquid treating chamber 380*a* applies a first liquid to the substrate W, and the rear end liquid treating chamber 380*b* applies a second liquid to the substrate W. The first liquid and the second liquid may be different types of liquid. In one example, the first liquid may be a liquid for forming an anti-reflective film and the second liquid may be a liquid for forming a photoresist film. The photoresist film may be formed on a substrate W to which an anti-reflective film has been applied. Optionally, the first liquid may be a liquid for forming a photoresist film, and the second liquid may be a liquid for forming an antireflective film. In this case, the anti-reflective film may be formed on the substrate W on which the photoresist film is formed. Optionally, the first liquid and the second liquid may be the same kind of liquid, and they may both be liquids for forming the photoresist film.

Referring to FIG. 4, the developing block 300*b* includes a buffer unit 310, a cooling unit 320, a transfer chamber 350, a heat treating chamber 360, and a liquid treating chamber 380.

The arrangement of the buffer unit 310, the cooling unit 320, the transfer chamber 350, the heat treating chamber 360, and the liquid treating chamber 380 in the developing block 300*b* may be the same as the arrangement of the buffer unit 310, the cooling unit 320, the transfer chamber 350, the heat treating chamber 360, and the liquid treating chamber 380 in the applying block 300*a*. When viewed from above, the buffer unit 310, the cooling unit 320, the transfer chamber 350, the heat treating chamber 360, and the liquid treating chamber 380 in the developing block 300*b* and the buffer unit 310, the cooling unit 320, the transfer chamber 350, the heat treating chamber 360, and the liquid treating chamber 380 in the applying block 300 may be disposed in overlapping positions.

The heat treating chamber 360 performs a heating process on the substrate W. The heating process includes a post-exposure baking process performed on the substrate W after the exposure process is completed, and a hard baking process performed on the substrate W after the development process is completed.

The liquid treating chamber 380 within the developing block 300*b* performs a developing process of developing the substrate W by supplying a developer onto the substrate W.

The housing 350 accommodating the buffer unit 310 within the developing block 300*b* is further provided with an entrance passage 351*a* for unloading the substrate W between the transfer robot 351 and the buffer unit 310. In this case, the cooling chamber 320 in the developing block 300*b* may not have an entrance passage formed on the side adjacent to the transfer mechanism 330.

In FIG. 3 or FIG. 4, the transfer chamber 350 is provided with the transfer robot 351. The transfer robot 351 transfers the substrate W between the buffer unit 310, the cooling chamber 320, the heat treating chamber 360, the liquid treating chamber 380, and the buffer unit 510 or the cooling chamber 520 of the interface module 500. In one example, the transfer robot 351 includes a hand 352 on which the substrate W is placed. The hand 352 may be provided to be movable forwardly and backwardly, rotatable about the third direction 16, and movable along the third direction 16. A guide rail 356, of which a longitudinal direction is parallel to the first direction 12, is provided within the transfer chamber 350, and the transfer robot 351 may be provided to be movable on the guide rail 356.

Figure 6:
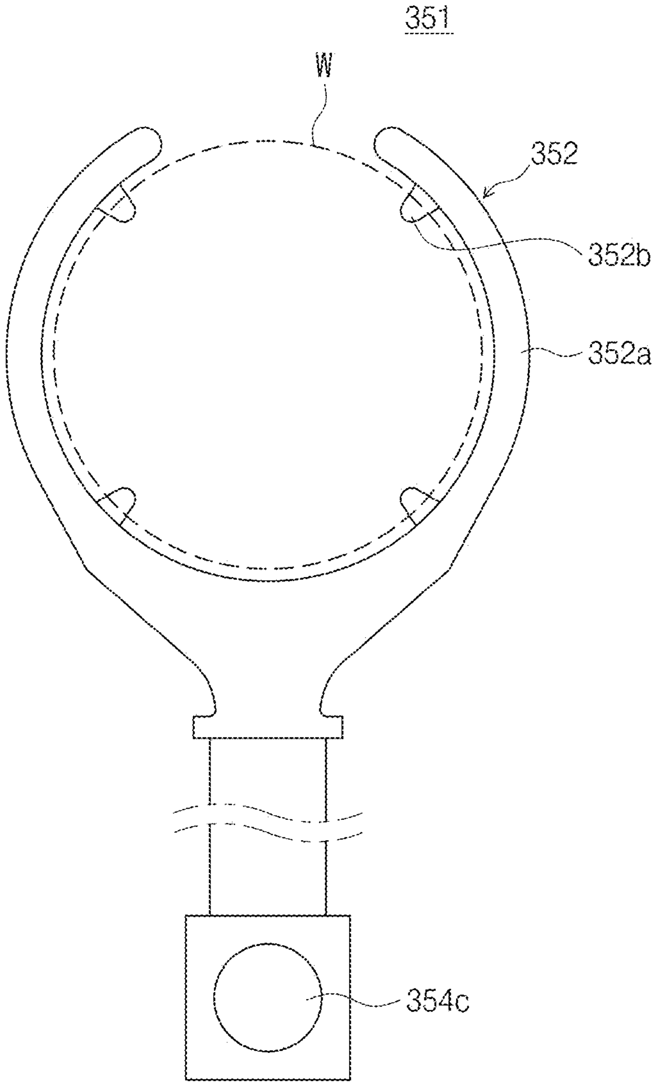
FIG. 6 is a top plan view schematically illustrating a transfer robot of FIG. 3.

FIG. 6 is a diagram illustrating one example of a hand of the transfer robot. Referring to FIG. 6, the hand 352 includes a base 352*a* and a support protrusion 352*b*. The base 352*a* may have an annular ring shape in which a portion of the circumference is bent. The base 352*a* has an inner diameter greater than the diameter of the substrate W. The support protrusion 352*b* extends inwardly from the base 352*a*. A plurality of support protrusions 352*b* is provided, and supports an edge region of the substrate W. In one example, support protrusions 352*b* may be provided in four equally spaced rows.

Figure 7:
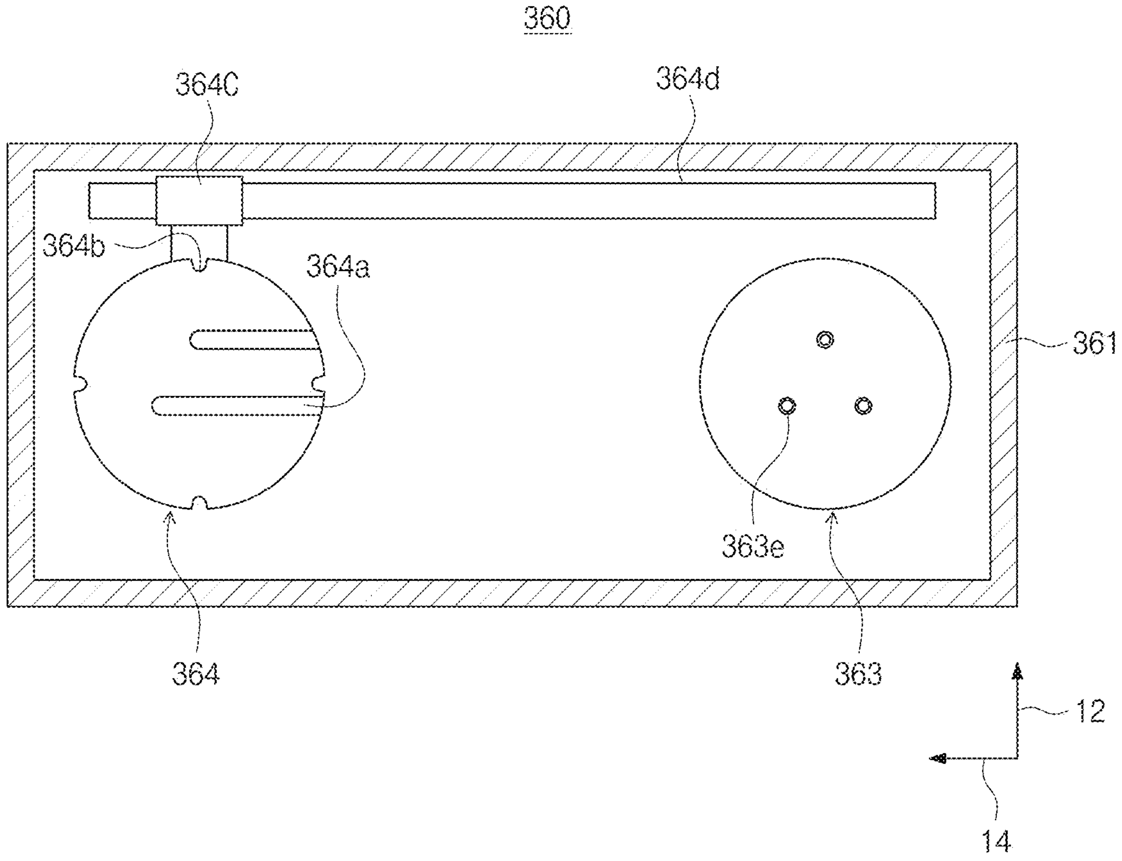
FIG. 7 is a top plan view schematically illustrating one example of a heat treating chamber of FIG. 3 or FIG. 4.
Figure 8:
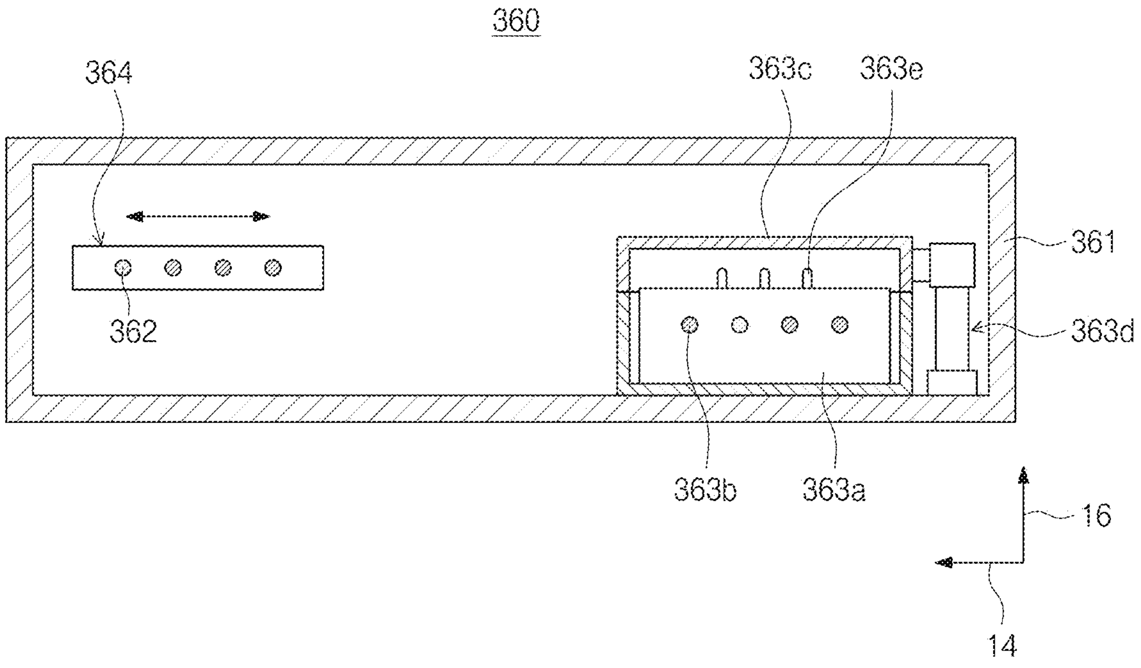
FIG. 8 is a front view of the heat treating chamber of FIG. 7.

FIG. 7 is a top plan view schematically illustrating one example of the heat treating chamber of FIG. 3 or FIG. 4, and FIG. 8 is a front view of the heat treating chamber of FIG. 7.

Referring to FIGS. 7 and 8, the heat treating chamber 360 includes a housing 361, a heating unit 363, and a transfer plate 364.

The housing 361 is provided in the shape of a generally rectangular parallelepiped. In the sidewall of the housing 361, an entrance opening (not illustrated) is formed through which the substrate W enters and exits. The entrance opening may remain open. Optionally, a door (not illustrated) may be provided to open and close the entrance opening. The heating unit 363 and the transfer plate 364 are provided within the housing 361.

The heating unit 323 includes a heating plate 363*a*, a cover 363*c*, and a heater 323*b*. The heating plate 363*a* has a generally circular shape when viewed from above. The heating plate 363*a* has a larger diameter than the substrate W. The heater 363*b* is installed on the heating plate 363*a*. The heater 363*b* may be provided as a heating wire or heating pattern that is heated by the supply of electrical power. The heating plate 363*a* is provided with a lift pin 363*e*. The lift pin 363*e* is provided to be movable in an upward and downward direction along the third direction 16. The lift pin 363*e* receives the substrate W from the transfer robot 352 and places the received substrate W on the heating plate 363*a*, or lifts the substrate W from the heating plate 363*a* and hands the substrate over to the transfer robot 352. According to the example, three lift pins 363*e* may be provided. The cover 363*c* has a space with an open lower portion therein. The cover 363*c* is located above the heating plate 363*a* and is moved in a vertical direction by a driver 363*d*. The space formed by the cover 363*c* and the heating plate 363*a* according to the movement of the cover 363*c* is provided as a heating space for heating the substrate W.

The transfer plate 364 is provided in a substantially disk shape, and has a diameter corresponding to that of the substrate W. A notch 364*b* is formed at an edge of the transfer plate 364. The notch 364*b* may have a shape that corresponds to the protrusion 352*b* formed on the hands of the transfer robot 352 described above. Further, the notches 364*b* are provided in a number corresponding to the protrusions 352*b* formed on the hand, and are formed at locations corresponding to the protrusions 352*b*. In a position in which the hand and the transfer plate 364 are arranged in the vertical direction, the substrate W is transferred between the hand 354 and the transfer plate 364 when the vertical position of the hand and the transfer plate 364 is changed. The transfer plate 364 is mounted on a guide rail 364*d*, and may be movable along the guide rail 364*d* by the driver 364*c*.

A plurality of slit-shaped guide grooves 364*a* is provided in the transfer plate 364. The guide grooves 364*a* extend from a distal end of the transfer plate 364 to an interior of the transfer plate 364. The longitudinal direction of the guide groove 364*a* is provided along the second direction 14, and the guide grooves 364*a* are spaced apart from each other along the first direction 12. The guide groove 364*a* prevents the transfer plate 364 and the lift pins 363*e* from interfering with each other when the substrate W is transferred between the transfer plate 364 and the heating unit 363.

The transfer plate 364 is provided with a thermally conductive material. In one example, the transfer plate 364 may be provided from a metal material.

A cooling flow path 364 is formed in the transfer plate 364. The cooling flow path 364 is supplied with coolant. The substrate W, which has been heated in the heating unit 363, may be cooled while being transferred by the transfer plate 364. Also, the substrate W may be cooled on the transfer plate 364 while the transfer plate 364 is stopped for the substrate W to be taken over by the transfer robot 351.

Optionally, a cooling chamber (not illustrated) may be further provided within the housing 361. In this case, the cooling chamber may be arranged in parallel with the heating unit 363. The cooling chamber may be provided as a cooling plate having a passage formed therein through which coolant flows. The substrate that has been heated in the heating unit may be transferred to the cooling chamber to be cooled.

Figure 9:
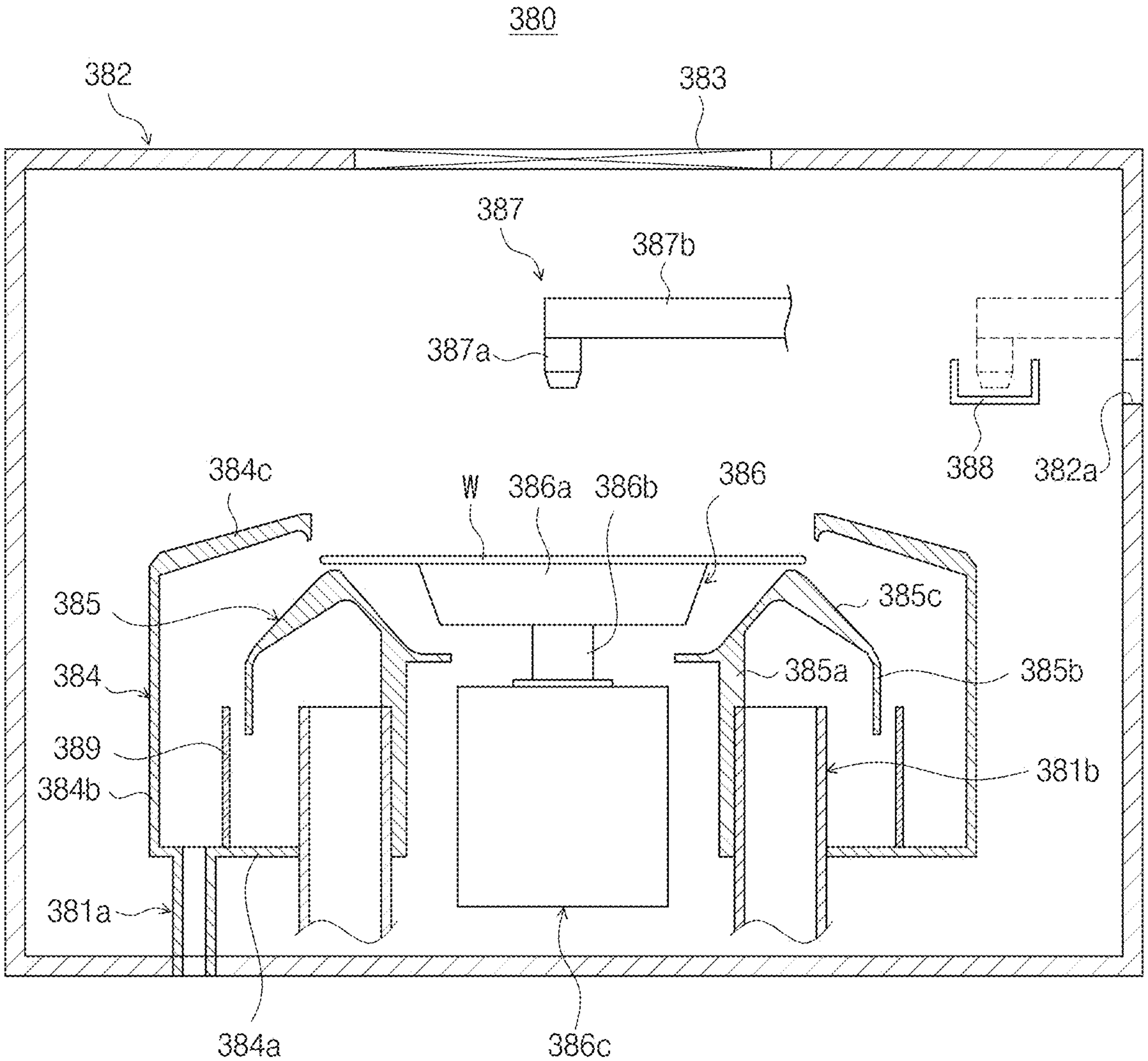
FIG. 9 is a cross-sectional view schematically illustrating one example of a liquid treating chamber of FIG. 3 or 4.

FIG. 9 is a front view schematically illustrating the liquid treating chamber of FIG. 3 or 4.

Referring to FIG. 9, the liquid treating chamber 380 includes a housing 382, an outer cup 384, a support unit 386, and a liquid supply unit 387.

The housing 382 is provided in a rectangular cylindrical shape having an inner space. An opening 382*a* is formed in one side of the housing 382. The opening 382*a* functions as a passage through which the substrate W enters and exits. A door (not illustrated) is installed in the opening 382*a*, and the door opens and closes the opening.

An inner space of the housing 382 is provided with the outer cup 384. The outer cup 384 has a treatment space with an open top.

A support unit 386 supports the substrate W within the treatment space of the outer cup 384. The support unit 386 includes has a support plate 386*a*, a rotation shaft 386*b*, and a driver 386*c*. The support plate 386*a* is provided with a circular top surface. The support plate 386*a* has a diameter smaller than the substrate W. The support plate 386*a* is provided to support the substrate W by vacuum pressure. The rotation shaft 386*b* is coupled to the center of the lower surface of the support plate 386*a*, and the driver 386*c* is provided on the rotation shaft 386*b* to provide rotational force to the rotation shaft 386*b*. The driver 386*c* may be a motor. Additionally, a lifting driver (not illustrated) may be provided to adjust the relative height of the support plate 386*a* and the outer cup 384.

The liquid supply unit 387 supplies the treatment solution onto the substrate W. When the liquid treating chamber 380 is provided in the applying block 300*a*, the treatment solution may be a liquid for forming a photoresist film, an anti-reflective film, or a protective film. When the liquid treating chamber 380 is provided in the developing block 300*b*, the treatment solution may be a developer liquid. The liquid supply unit 387 has a nozzle 387*a*, a nozzle support 387*b*, and a liquid supply source (not illustrated). The nozzle 387*a* discharges the treatment solution onto the substrate W. The nozzle 387*a* is supported on a nozzle support 387*b*. The nozzle support 387*b* moves the nozzle 387*a* between a process position and a standby position In the process position, the nozzle 387*a* supplies the treatment solution to the substrate W placed on the support plate 386*a*, and after completing the supply of the treatment solution, the nozzle 387*a* waits in the standby position. In the standby position, the nozzle 387*a* waits at a groove port 388, the groove port 388 is located on the outside of the outer cup 384 within the housing 382.

On the top wall of the housing 382 is disposed a fan filter unit 383 that supplies a downward airflow to the interior space. The fan filter unit 383 has a fan that introduces air from the outside into the inner space and a filter that filters the air from the outside.

The outer cup 384 has a bottom wall 384*a*, a sidewall 384*b*, and a top wall 384*c*. The inner of the outer cup 384 is provided as an inner space described above. The inner space H includes a treatment space at the top and an exhaust space at the bottom.

The bottom wall 384*a* is provided in a circular shape and has an opening in the center. The sidewall 384*b* extends upwardly from the outer end of the bottom wall 384*a*. The sidewall 384*b* is provided in a ring shape and is provided vertical to the bottom wall 384*a*. In one example, the sidewall 384*b* extends to a height equal to the top surface of the support plate 386*a*, or extends to a height slightly lower than the top surface of the support plate 386*a*. The top wall 384*c* has a ring shape, with an opening in the center. The top wall 384*c* is provided with an upward slope from the top end of the sidewall 384*b* toward the center axis of the outer cup 384.

The guide cup 385 is positioned on the inner side of the outer cup 384. The guide cup 385 has an inner wall 385*a*, an outer wall 385*b*, and a top wall 385*c*. The inner wall 385*a* has a through hole that is perforated in the vertical direction. The inner wall 385*a* is arranged to surround the driver 386*c*. The inner wall 385*a* minimizes the exposure of the driver 386*c* to the airflow 84 in the treatment space. The rotational shaft 386*b* and/or the driver 386*c* of the support unit 386 extend in the vertical direction through the through-hole. The outer wall 385*b* is spaced apart from the inner wall 385*a* and is disposed to surround the inner wall 385*a*. The outer wall 385*b* is spaced apart from the sidewall 384*b* of the outer cup 384. The inner wall 385*a* is spaced upwardly from the bottom wall 384*a* of the outer cup 384. The top wall 385*c* connects the upper end of the outer wall 385*b* with the upper end of the inner wall 385*a*. The top wall 385*c* has a ring shape and is disposed to surround the support plate 386*a*. In one example, the top wall 385*c* has an upwardly convex shape.

The space below the support plate 386*a* in the treatment space may be provided as an exhaust space. In one example, the exhaust space may be defined by the guide cup 385. The space surrounded by the outer wall 385*b*, the top wall 385*c*, and the inner wall 385*a* of the guide cup 385 and/or the space below the space may be provided as the exhaust space.

The outer cup 384 may be provided with a gas-liquid separation plate 389. A gas-liquid separation plate 389 may be provided to extend upwardly from the bottom wall 384*a* of the outer cup 384. The gas-liquid separation plate 1230 may be provided in a ring shape. The gas-liquid separation plate 389 may be positioned between the sidewall 384*b* of the outer cup 384 and the outer wall 385*b* of the guide cup 385 when viewed from above. The top end of the gas-liquid separation plate 389 may be positioned lower than the bottom end of the outer wall 385*b* of the guide cup 385.

The bottom wall 384*a* of the outer cup 384 is connected to an outlet pipe 381*a* for discharging the treatment liquid and an exhaust pipe 381*b*. The outlet pipe 381*a* may be connected to the outer cup 384 from the outer side of the gas-liquid separation plate 389. The exhaust pipe 381*b* may be connected to the outer cup 384 from an inner side of the gas-liquid separation plate 389.

The interface module 500 connects the treating module 300 with an external exposure device 700. The interface module 500 includes an interface frame 501, a buffer unit 510, a cooling chamber 520, a transfer mechanism 530, an interface robot 540, and an additional process chamber 560.

The top of the interface frame 501 may be provided with a fan filter unit forming a downward airflow therein. The buffer unit 510, the cooling chamber 520, the transfer mechanism 530, the interface robot 540, and the additional process chamber 560 are disposed inside the interface frame 501.

The structure and arrangement of the buffer unit 510 and the cooling chamber 520 may be the same or similar to those of the buffer unit 310 and the cooling chamber 320 provided in the treating module 300. The buffer unit 510 is disposed adjacent to the end of the transfer chamber 350. The substrate W transferred between the treating module 300, the cooling chamber 520, the additional process chamber 560, and the exposure device 700 may temporarily reside in the buffer unit 510.

The cooling chamber 520 may be provided only at a height corresponding to the applying block 300*a* between the applying block 300*a* and the developing block 300*b*. Additionally, the cooling chamber 520 may be provided in the same form as the cooling chamber 320 as described above. For example, the cooling chamber 520 may be configured to receive the cooling plate on the inner side of the housing, such that moisture may be independently controlled when cooling the substrate W, and the effect of external airflow is minimized. Accordingly, the cooling chamber 520 is configured to be disposed in a vertical region of the buffer unit 510, so that the cooling chamber 520 may receive the substrate W by the transfer mechanism 531. Further, the cooling chamber 520 is provided to not overlap the buffer unit 510 when viewed from above.

The transfer mechanism 530 may transfer the substrate W between the buffer units 510. The transfer mechanism 530 may also transfer the substrate W between the buffer unit 510 and the cooling chamber 520. The transfer mechanism 530 may be provided with the same or similar structure as the transfer mechanism 330 of the treating module 300. Another transfer mechanism 531 may be further provided in a region opposite the region where the transfer mechanism 530 is provided relative to the buffer unit 510.

The interface robot 540 is disposed between the buffer unit 510 and the exposure device 700. The interface unit 540 is provided to transfer the substrate W between the buffer unit 510, the cooling chamber 520, the additional process chamber 560, and the exposure unit 700. The interface robot 540 includes a hand 542 on which the substrate W is placed, and the hand 542 may be provided to be movable forwardly and backwardly, rotatable about the third direction 16, and movable along the third direction 16.

The additional process chamber 560 may perform a predetermined additional process before the substrate W processed in the applying block 300*a* is loaded to the exposure device 700. Optionally, the additional process chamber 560 may perform a predetermined additional process before the substrate W processed in the exposure device 700 is loaded to the developing block 300*b*. In one example, the additional process may be an edge exposure process that exposes an edge region of the substrate W, or a top surface cleaning process that cleans the top surface of the substrate W, or a bottom surface cleaning process that cleans the bottom surface of the substrate W, or an inspection process that performs a predetermined inspection on the substrate W. A plurality of additional process chambers 560 may be provided, which may be stacked on top of each other.

Figure 10:
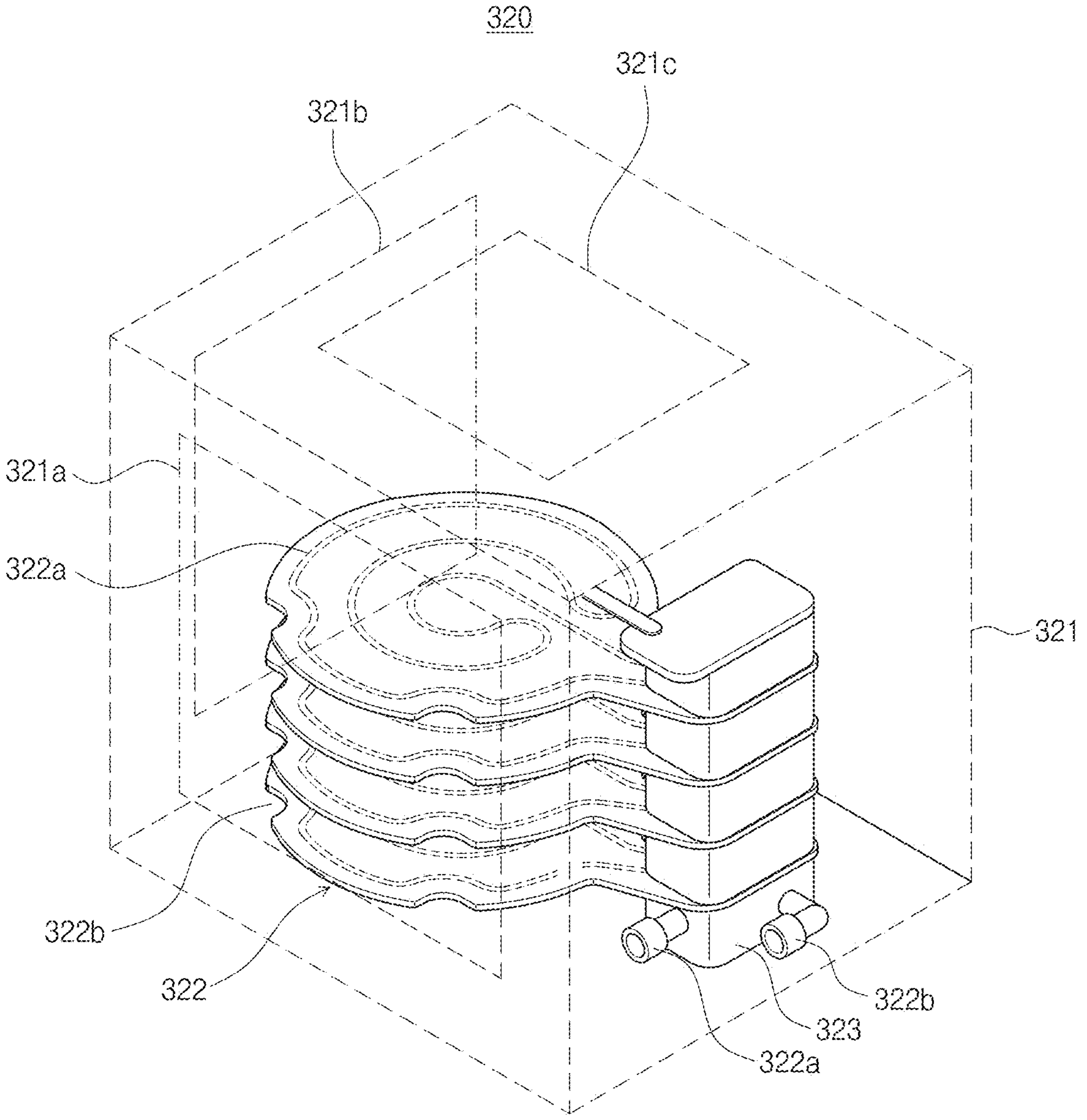
FIG. 10 is a perspective view schematically illustrating one example of the cooling chamber of FIGS. 3 and 4.

FIG. 10 is a perspective view schematically illustrating one example of the cooling chamber of FIGS. 3 and 4.

Referring further to FIG. 10, the cooling chamber 320 may include a housing 321, a cooling plate 322, and a support 323.

The housing 321 has a substantially cuboidal shape and provides space for the cooling plate 322 and the support 323 to be accommodated. Here, the housing 321 may provide a plurality of seating regions such that the plurality of units consisting of the cooling plates 322 and the supports 323 is mounted separately, when the cooling plates 322 and the supports 323 configure a plurality of units. Furthermore, the side, except for the region where the substrate W is loaded and unloaded, among the four sides of the housing 321 is provided in the form of walls to minimize the impact on airflow. Of the four sides of the housing 321, the side facing the transfer mechanism 330 may be formed with an entrance passage 321*a* for loading the substrate W. Furthermore, the housing 321 may have the side further formed with an entrance passage 321*b* for loading and unloading the substrate W, the side facing the transfer robot 351 among the four sides. The area of the entrance passages 321*a* and 321*b* is formed in a smaller area than the area of one side of the housing 321. Thus, the housing 321 is capable of forming a differential pressure in which the pressure inside is higher than that of the buffer module.

Further, on the upper wall of the housing 321, a fan filter unit 321*c* may be disposed that supplies downward airflow to the interior space. The fan filter unit 321*c* includes a fan that introduces air from the outside into the inner space and a filter that filters the air from the outside. As a result, the inside of the housing 321 is exhausted and the internal pressure forms a second negative pressure. The second negative pressure is formed to be lower than the first negative pressure and higher than the third negative pressure.

A plurality of cooling plates 322 are provided, which may be stacked on top of each other in the third direction 16. The cooling plates 322 are disposed at a certain distance apart from each other. Within each of the cooling plates 322, a cooling flow path 322*a* is formed through which a cooling fluid flows. The cooling fluid may be water. The cooling plates 322 provide a region on which the substrate W is seated, and when the substrate W is seated, the cooling plates 322 cool the substrate W by heat conduction of cold air. The cooling plate 322 is generally provided with a disk shape and has a diameter corresponding to the substrate W. Further, the cooling plate 322 may have a cooling flow path 322*a* formed therein through which a cooling fluid may flow. Also, a notch 322*b* is formed at an edge of the cooling plate 322. The notch 322*b* may have a shape corresponding to a protrusion formed on the hand of the transfer robot 351. Further, the notches 322*b* are provided in a number corresponding to the protrusions formed on the hand of the transfer robot 351, and are formed at positions corresponding to the protrusions. When the vertical positions of the hand of the transfer robot 351 and the cooling plate 322 are changed in the positions in which the hand of the transfer robot 351 and the cooling plate 322 are aligned in the vertical direction, the substrate W is transferred between the hand of the transfer robot 351 and the cooling plate 322.

A longitudinal direction of the support 323 is provided in the third direction 16 and supports a plurality of cooling plates 322. Within the support 323, a distribution line (not illustrated) is formed through which the cooling fluid flows. The cooling flow paths 322*a* provided in the cooling plates 322 are branched off from the distribution line (not illustrated). The support 323 is formed with an inlet port 323*a* through which cooling fluid from the outside is introduced from the cooling plates 322 and an outlet port 323*b* through which cooling fluid is discharged to the outside. The distribution line is connected with the inlet port 323*a* and the outlet port 323*b*.

The following describes the substrate processing method of the substrate processing apparatus as described above.

In the following description, the "substrate processing method before exposure" and the "substrate processing method after exposure" will be described respectively.

Figure 11:
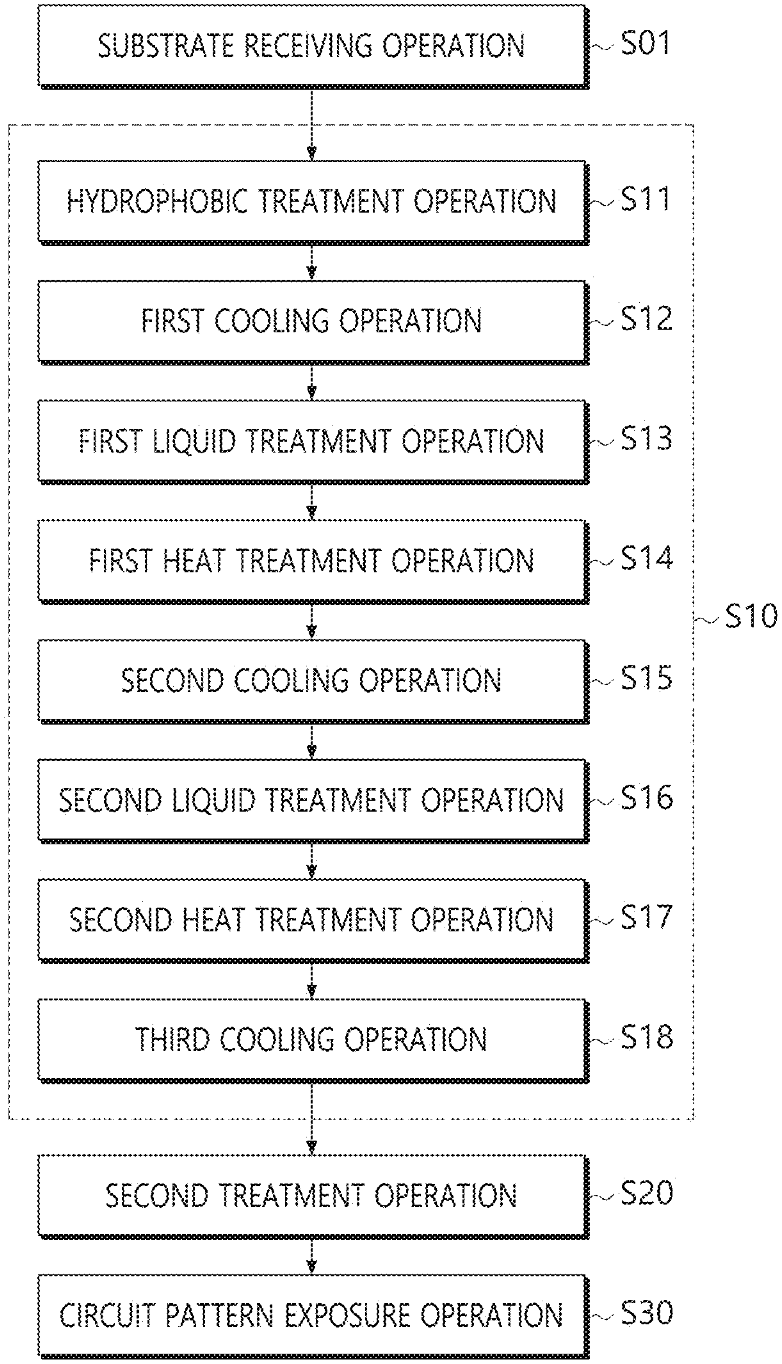
FIG. 11 is a flowchart of a substrate processing method prior to exposure according to an exemplary embodiment of the present invention.
Figure 12:
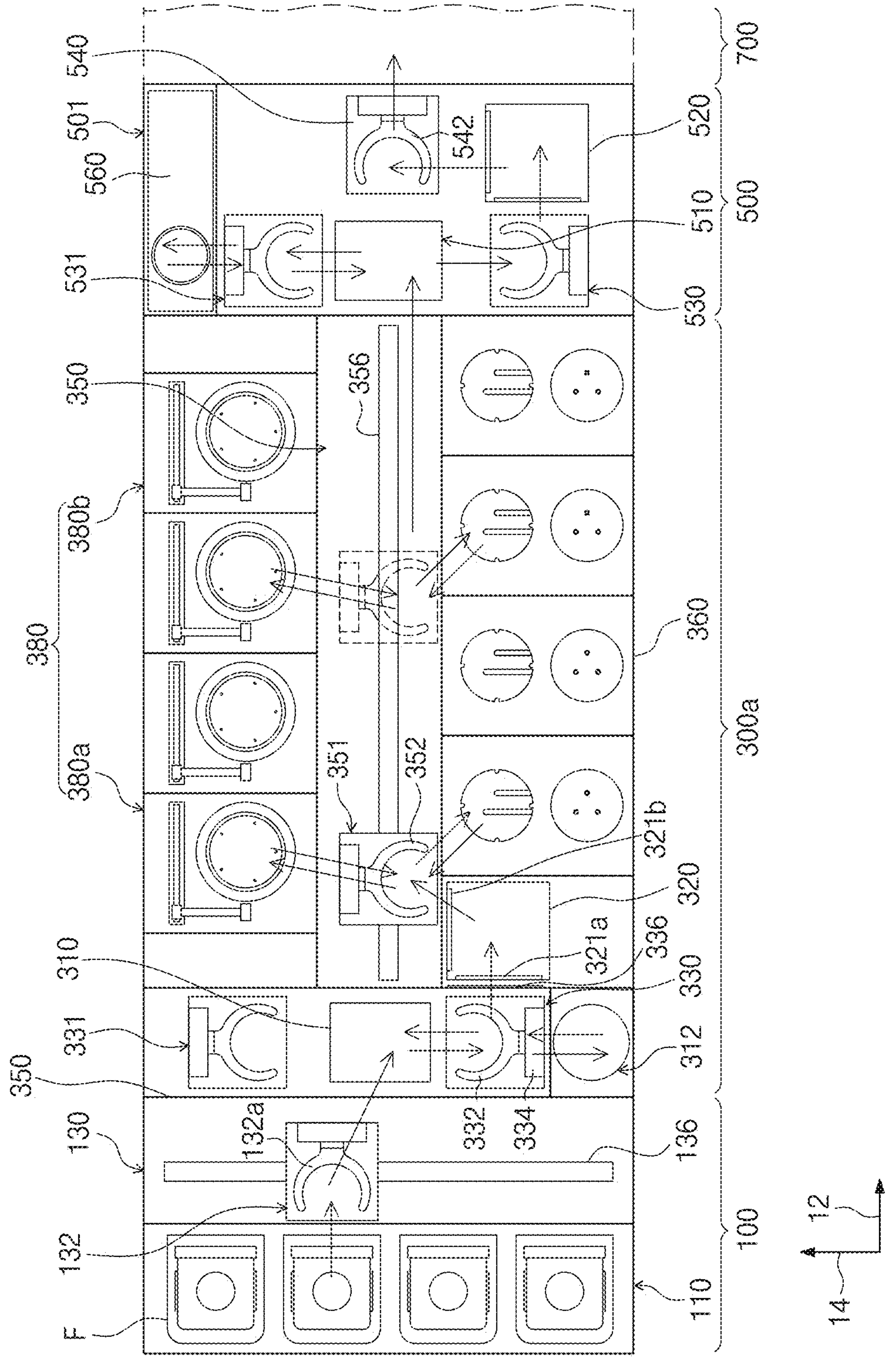
FIG. 12 is a diagram schematically illustrating a substrate transfer path in accordance with the sequence of the substrate processing method of FIG. 11.

FIG. 11 is a flowchart of a substrate processing method prior to exposure according to an exemplary embodiment of the present invention. FIG. 12 is a diagram schematically illustrating a substrate transfer path in accordance with the sequence of the substrate processing method of FIG. 11.

Referring further to FIGS. 11 and 12, the "substrate processing method before exposure" of the present invention may include a substrate receiving operation S01, a film treatment operation S10, a second processing operation S20, and a circuit pattern exposure operation S30.

First, in the substrate receiving operation S01, the index robot 132 of the index module 20 transfers the substrate W loaded in by the container of the load port 10 to the buffer unit 310.

Next, the film treatment operation S10 may include a hydrophobic treatment operation S11, a first cooling operation S12, a first liquid treatment operation S13, a first heat treatment operation S14, a second cooling operation S15, a second liquid treatment operation S16, a second heat treatment operation S17, and a third cooling operation S18.

In the hydrophobic treatment operation S11, the transfer mechanism 330 loads the substrate W in the first buffer 310 into the hydrophobization chamber 312. In this case, the hydrophobization chamber 312 treats the received hydrophilic substrate W to be hydrophobic. Here, the hydrophobization chamber 312 may treat the substrate W to be hydrophobic by using HMDS (Hecamethyldisilazane) vapor gas.

Then, in the first cooling operation S12, the transfer mechanism 330 loads the substrate W hydrophobically treated in the hydrophobic treatment operation S11 into the cooling chamber 320. In this case, the cooling chamber 320 cools the received substrate W. In this case, the cooling chamber 320 is formed at a second negative pressure, so that no airflow flows toward the transfer mechanism 330 forming a third negative pressure.

Next, in the first liquid treatment operation S13, the transfer robot 351 moves to the cooling chamber 320 side and transfers the substrate W in the cooling chamber 320 to the front end liquid treating chamber 380*a*. In this case, the front end liquid treating chamber 380*a* may form an anti-reflective film on the top surface of the substrate W.

Then, in the first heat treatment operation S14, the transfer robot 351 transfers the substrate W in which the anti-reflective film has been treated to the transfer plate 364 of the heat treating chamber 360 according to the treatment process. More specifically, the transfer robot 351 seats the substrate W on the transfer plate 364, and the transfer plate 364 moves in one direction to seat the substrate W on the lift pin 363*e* of the heating plate 363*a*. The substrate W seated on the lift pin 363*e* is in close contact with the heating plate

363*a* by the lowering of the lift pin 363*e*, and is heated by the heated heating plate 363*a* to heat treat the anti-reflective film.

Then, in the second cooling operation S15, the transfer plate 364 transfers the substrate W toward the transfer robot 351 while the substrate W is raised by the lift pin 363*e*, and the transfer robot 351 receives the heat-treated substrate W in the heat treating chamber 360 from the transfer plate 364, and transfers the received substrate W to the cooling chamber 320 again. In this case, the cooling chamber 320 cools the substrate W in the same cooling manner as described above to remove the particles.

Next, in the second liquid treatment operation S16, the transfer robot 351 moves to the side of the cooling chamber 320 to load the substrate W in the cooling chamber 320 to the rear end liquid treating chamber 380*b*. In this case, the rear end liquid treating chamber 380*b* forms a photoresist film on the top surface of the substrate W by the same application method as described above.

Next, in the second heat treatment operation S17, the transfer robot 351 transfers the substrate W in which the photoresist film is treated to the transfer plate 364 of the heat treating chamber 360. In this case, the transfer robot 351 seats the substrate W on the transfer plate 364, and the transfer plate 364 moves in one direction to seat the substrate W on the lift pin 363*e* of the heating plate 363*a*. The substrate W seated on the lift pin 363*e* is in close contact with the heating plate 363*a* by the lowering of the lift pin 363*e*, and is heated by the heated heating plate 363*a* to heat treat the anti-reflective film.

Then, in the third cooling operation S18, the transfer plate 364 transfers the substrate W toward the transfer robot 351 while the substrate W is raised by the ascent of the lift pin 363*e*, and then the transfer robot 351 receives the heat-treated substrate W in the heat treating chamber 360 from the transfer plate 364, and loads the received substrate W to the cooling chamber 320 again. In this case, the cooling chamber 320 cools the substrate W in the same cooling manner as described above to remove the particles. In this case, the process from the first liquid treatment operation S13 to the second cooling operation S15 for heat treatment after applying the anti-reflective film described above may be performed in a different order from the process from the second liquid treatment operation S16 to the third cooling operation S18 for heat treatment after applying the photoresist film. Furthermore, the process from the first liquid treatment operation S13 to the second cooling operation S15 and the process from the second liquid treatment operation S16 to the third cooling operation S18 may be alternated with each other and performed many times to form photoresist films and anti-reflective films in multiple layers.

Next, in the second processing operation S20, the transfer robot 351 transfers the substrate W in the cooling chamber 320 to the buffer unit 510 of the interface module 500. Next, the transfer mechanism 531 loads the substrate in the buffer unit 510 into the additional process chamber 560. Next, the additional process chamber 560 performs the additional process. In this case, the additional process may be an edge exposure process to expose an edge region of the substrate W, a top surface cleaning process to clean the top surface of the substrate W, a bottom surface cleaning process to clean the bottom surface of the substrate W, or an inspection process to perform a predetermined inspection on the substrate W, as described above. The transfer mechanism 531 transfers the substrate W that has completed the additional process from the additional process chamber 560 to the buffer unit 510.

Furthermore, in the second processing operation 520, the transfer mechanism 530 loads the substrate W loaded into the buffer unit 510 to the cooling chamber 520, and the cooling chamber 520 cools the substrate W.

Further, in the second processing operation 520, the interface robot 540 loads the substrate W cooled in the cooling chamber 520 to the exposure device 700.

Then, in the circuit pattern exposure operation 530, the exposure device 700 exposes the photoresist film of the substrate W in the form of a circuit pattern while the mask is positioned on the top surface of the substrate W.

On the other hand, the substrate W treated by the above-mentioned "substrate processing method before exposure" is subjected to the "substrate processing method after exposure".

Figure 13:
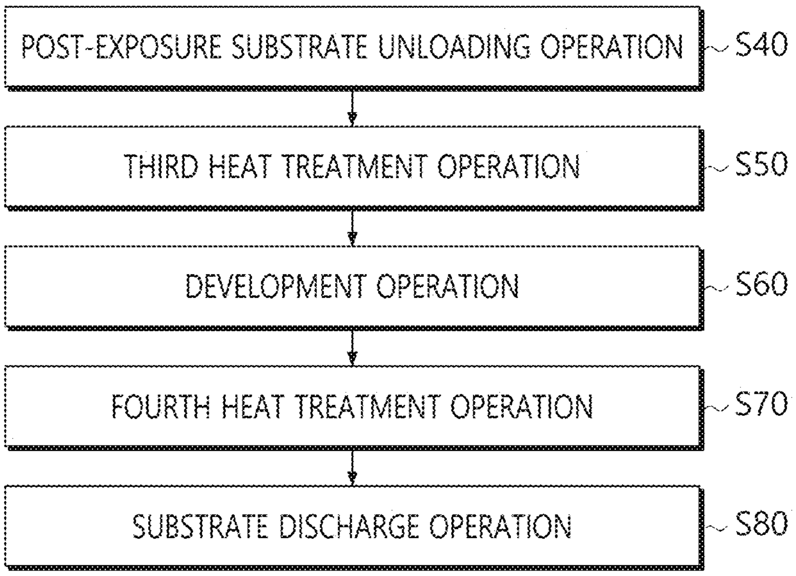
FIG. 13 is a flowchart of the substrate processing method after exposure according to the exemplary embodiment of the present invention.
Figure 14:
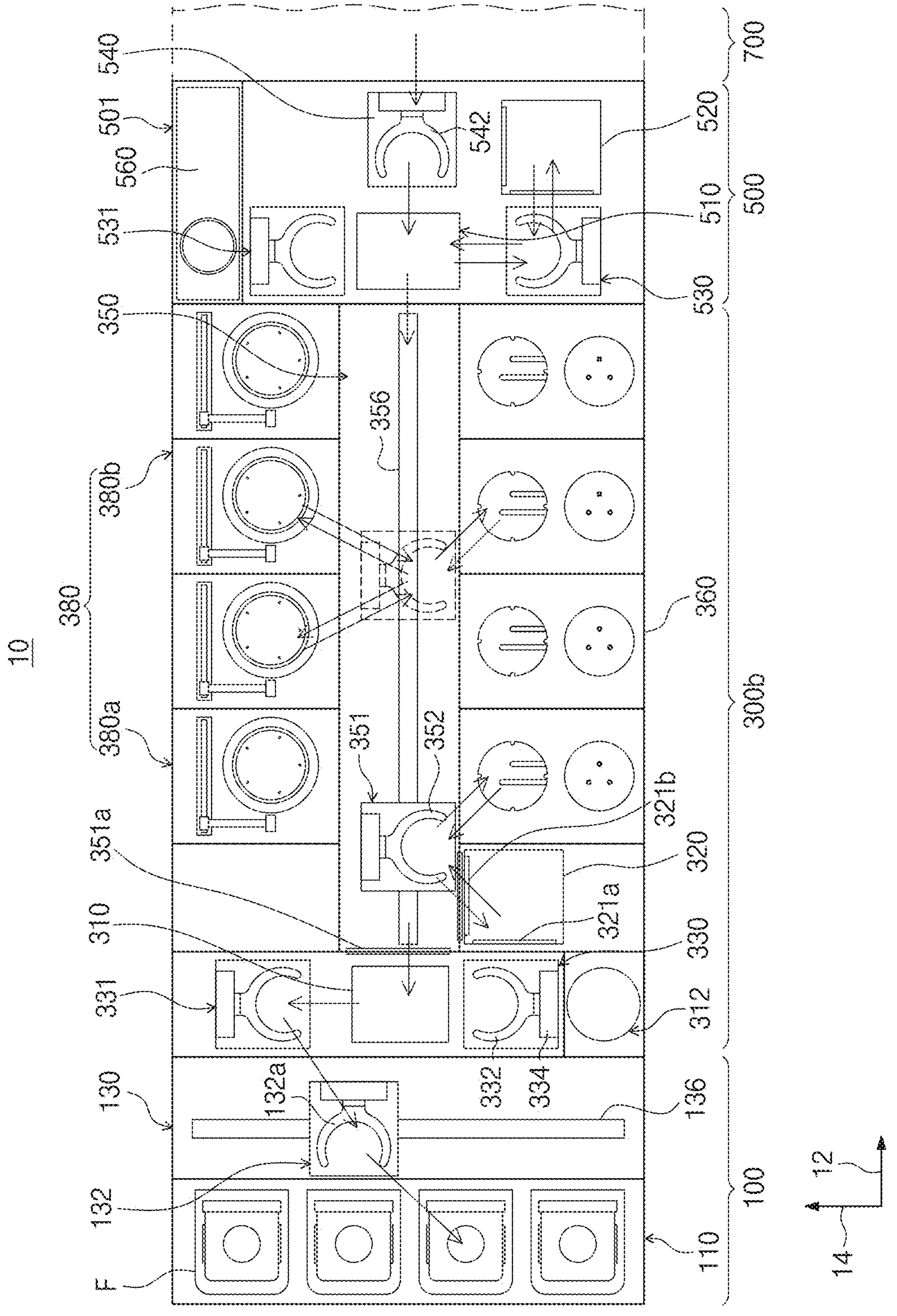
FIG. 14 is a diagram schematically illustrating a substrate transfer path in accordance with the sequence of the substrate processing method of FIG. 13.

FIG. 13 is a flowchart of the substrate processing method after exposure according to the exemplary embodiment of the present invention. FIG. 14 is a diagram schematically illustrating a substrate transfer path in accordance with the sequence of the substrate processing method of FIG. 13.

Referring further to FIGS. 13 and 14, a "substrate processing method after exposure" according to the exemplary embodiment of the present invention may include a post-exposure substrate unloading operation S40, a third heat treatment operation S50, a development operation S60, a fourth heat treatment operation S70, and a substrate discharge operation S80.

First, in the post-exposure substrate unloading out operation S40, the interface robot 540 loads the substrate W whose circuit pattern has been exposed by the exposure device 80 to the buffer unit 510. Furthermore, in the post-exposure substrate unloading operation S40, if necessary, the transfer mechanism 530 may load the substrate W into the cooling chamber 520 to cool the substrate W, and load the substrate W cooled in the cooling chamber 520 into the buffer unit 510.

Next, in the third heat treatment operation S50, the interface robot 540 unloads the substrate W from the buffer unit 510 and loads the substrate W into the heat treating chamber 360, and the substrate W is heat treated in the heat treating chamber 360. The third heat treatment operation S50 may be a soft heat treatment process. In this case, the transfer robot 351 seats the substrate W on the transfer plate 364, and the transfer plate 364 moves in one direction to seat the substrate W on the lift pin 363*e* of the heating plate 363*a*. The substrate W seated on the lift pin 363*e* is in close contact with the heating plate 363*a* by the lowering of the lift pin 363*e*, and is heat treated by the heated heating plate 363*a*. On the other hand, in the third heat treatment operation S50, after the heat treatment process of heating the substrate W is carried out, heat treatment of cooling the substrate W may be carried out as necessary. In this case, the substrate W may be cooled by a cooling plate (not illustrated) within the heat treating chamber 360, or the substrate W may also be cooled through the process of transferring the substrate W to the cooling chamber 320.

Next, in the development operation S60, the transfer robot 351 transfers the substrate W cooled by the heat treating chamber 360 to the liquid treating chamber 380 of the developing block 300*b*, and develops the transferred substrate W in the liquid treating chamber 380.

Then, in the fourth heat treatment operation S70, the transfer robot 351 loads the developed substrate W in the liquid treating chamber 380 into the heat treating chamber 360, and the transferred substrate W is heat treated in the heat treating chamber 360. The third heat treatment operation S70 may be a hard heat treatment process. In the fourth heat treatment operation S70, by heat treating the substrate W at a higher temperature than the third heat treatment operation S50, the remaining developer may be completely removed. On the other hand, in the fourth heat treatment operation S70, after the heat treatment process of heating the substrate W is carried out, the substrate W is cooled in the cooling chamber 320. The cooled substrate W is then transferred to the buffer unit 310 by the transfer robot 351.

Next, in the substrate discharge operation S80, the transfer unit 331 hands over the substrate W loaded in the buffer unit 310 to the index robot 132, and the index robot 132 transfers the received substrate W to the load port 10. Then, the substrate W discharged to the load port 10 is transferred to the subsequent processing facility (not illustrated) side in the state of being mounded in the container F.

Hereinafter, the internal negative pressure of the substrate processing apparatus according to the present invention will be described.

Figure 15:
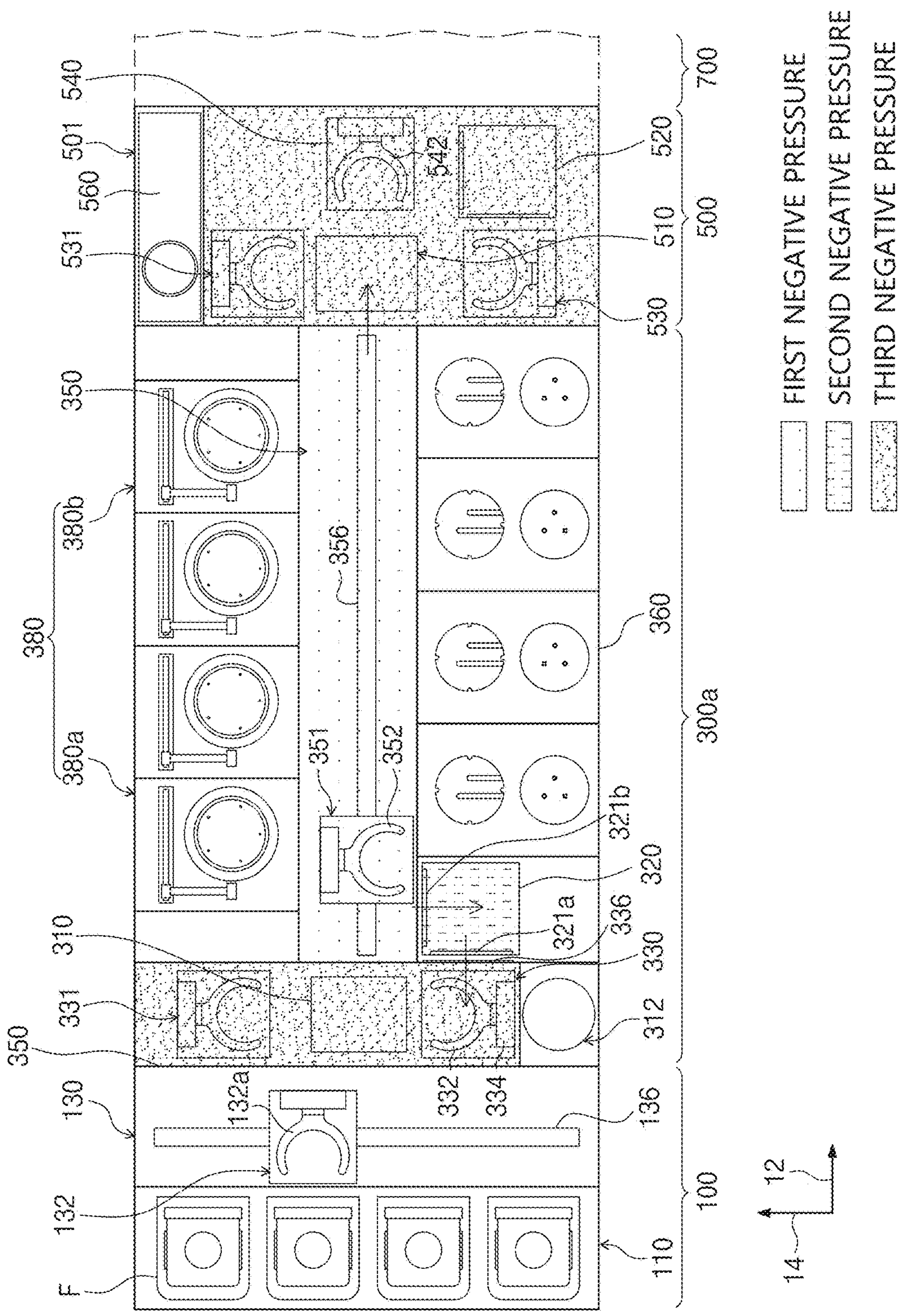
FIG. 15 is a diagram schematically illustrating an internal negative pressure of the substrate processing apparatus according to the present invention.

FIG. 15 is a diagram schematically illustrating an internal negative pressure of the substrate processing apparatus according to the present invention.

As illustrated in FIG. 15, in the substrate processing apparatus according to the present invention, internal negative pressures of the buffer module in which the buffer unit 310 is located in the applying block 300*a*, the cooling chamber 320, the transfer chamber 350, and the interface module 500 are set differently from each other. Here, the buffer module, the cooling chamber 320, the transfer chamber 350, and the interface module 500 may each have different internal negative pressures by adjusting the amount of intake of air introduced into each of them, or by adjusting the amount of exhaust of air discharged.

As described above, the interior of the transfer chamber 350 is set to a first negative pressure, the interior of the cooling chamber 320 is set to a second negative pressure, and the buffer module in which the buffer unit 310 is located is set to a third negative pressure. In this case, the interface module 500 may be set to the third negative pressure.

Thus, the transfer chamber 350 is formed so that airflow is exhausted to the buffer module, the cooling chamber 320, and the interface module 500 having a relatively low negative pressure, so that particles generated on the side of the buffer module where the buffer unit 310 is located or the interface module 500 are not introduced.

In this case, in the cooling chamber 320, airflow of the transfer chamber 350 is introduced into the entrance passage 321*b* adjacent to the transfer chamber 350, but no airflow is introduced from the access outlet passage 321*a* adjacent to the buffer module, due to the difference in negative pressure. Thus, the cooling chamber 320 is minimally affected by external particles introduced into the buffer module in which the buffer unit 310 is located. In this case, the buffer module in which the buffer unit 310 is located may not be equipped with a device for temperature control, so that the internal negative pressure does not become higher than the negative pressure in the cooling chamber 320.

It should be understood that exemplary embodiments are disclosed herein and that other variations may be possible. Individual elements or features of a particular exemplary embodiment are not generally limited to the particular exemplary embodiment, but are interchangeable and may be used in selected exemplary embodiments, where applicable, even if not specifically illustrated or described. The modifications are not to be considered as departing from the spirit and scope of the disclosure, and all such modifications that would be obvious to one of ordinary skill in the art are intended to be included within the scope of the accompanying claims.

What is claimed is:

1. A substrate processing apparatus comprising:
an index module;
a buffer module;
a treating module; and
an interface module, wherein
the index module includes
a load port configured to accommodate a container, the container configured to receive a substrate, and
an index frame provided with an index robot configured to transfer the substrate between the container placed in the load port and the buffer module, the buffer module includes
a first buffer unit configured to place the substrate thereon,
a housing configured to accommodate the first buffer unit, and
a first transfer mechanism accommodated in the housing and configured to transfer the substrate from the first buffer unit to a first cooling chamber, the treating module includes
the first cooling chamber configured to cool the substrate to be loaded from the buffer module,
a liquid treating chamber configured to liquid treat the substrate to be loaded from the first cooling chamber,
a heat treating chamber configured to heat treat the substrate to be loaded from the first cooling chamber, and
a transfer chamber between the liquid treating chamber and the heat treating chamber, the transfer chamber provided with a transfer robot configured to transfer the substrate to each of the liquid treating chamber, the heat treating chamber, and the first cooling chamber,
when viewed from above, the first cooling chamber and the first buffer unit do no overlap each other, and
the first transfer mechanism of the buffer module is configured to prevent the substrate in the first cooling chamber from being unloaded.

2. The substrate processing apparatus of claim 1, wherein
the interface module is further provided with a second buffer unit and a second cooling chamber, and
when viewed from above, the second buffer unit and the second cooling chamber do not overlap each other.

3. The substrate processing apparatus of claim 2, wherein the interface module further includes:
two second transfer mechanisms being opposite to each other with the second buffer unit interposed therebetween; and
an interface robot adjacent to the second buffer unit, and
the second cooling chamber is adjacent to any one of the two second transfer mechanisms and is adjacent to the interface robot.

4. The substrate processing apparatus of claim 1, wherein the first cooling chamber includes:
a cooling plate for supporting the substrate; and
a housing providing a space in which the cooling plate is accommodated.

5. The substrate processing apparatus of claim 4, wherein in the housing in which the cooling plate is accommodated, a side except for a region where the substrate is loaded and unloaded is provided in a form of a wall.

6. The substrate processing apparatus of claim 4, wherein the housing is configured to accommodate the cooling plate therein and includes an entrance passage configured to load and unload the substrate on a side in a direction facing the transfer robot.

7. The substrate processing apparatus of claim 6, wherein in the housing is configured to accommodate the cooling plate therein, the entrance passage is defined in an area less than an area of one side of the housing in which the cooling plate is accommodated.

8. The substrate processing apparatus of claim 1, wherein the housing includes an entrance passage through which the substrate is loaded in a region in which the first transfer mechanism and the first cooling chamber are adjacent to each other.

9. The substrate processing apparatus of claim 8, wherein the entrance passage is defined in an area less than an area of one side of the housing accommodating the first buffer unit.

10. The substrate processing apparatus of claim 8, wherein the first cooling chamber is adjacent to the buffer module, and is adjacent to the transfer chamber.

11. The substrate processing apparatus of claim 10, wherein among sides of the housing, a side adjacent to the buffer module is arranged perpendicular to a side adjacent to the transfer chamber.

12. The substrate processing apparatus of claim 10, wherein the first transfer mechanism of the buffer module is configured to load the substrate into the first cooling chamber, the transfer robot of the transfer chamber is configured to load the substrate loaded into the first cooling chamber into the liquid treating chamber or heat treating chamber.

13. The substrate processing apparatus of claim 8, wherein the first cooling chamber has a positive pressure relative to a pressure in the buffer module.

14. The substrate processing apparatus of claim 8, wherein the buffer module is provided so that a temperature control device for heating or cooling the substrate is not disposed.

15. The substrate processing apparatus of claim 1, wherein the first cooling chamber is adjacent to the transfer chamber, the first cooling chamber is on a side of the transfer chamber perpendicular to a longitudinal direction of the transfer chamber among a plurality of sides of the transfer chamber.

16. The substrate processing apparatus of claim 15, wherein the first cooling chamber is between the buffer module and the heat treating chamber, or is between the buffer module and the liquid treating chamber.

17. A substrate processing apparatus comprising:

an index module;

a buffer module;

a treating module; and an interface module, wherein the index module includes, a load port configured to accommodate a container, the container configured to receive a substrate, and an index frame provided with an index robot that is configured to transfer the substrate between the container placed in the load port and the buffer module, the buffer module includes a buffer unit configured to place the substrate thereon, a housing configured to accommodate the buffer unit, and a first transfer mechanism accommodated in the housing and configured to transfer the substrate from the buffer unit to a cooling chamber, the treating module includes the cooling chamber configured to cool the substrate loaded from the buffer module, a liquid treating chamber configured to liquid treat the substrate loaded from the cooling chamber, and a heat treating chamber configured to heat treat the substrate loaded from the cooling chamber, a transfer chamber between the liquid treating chamber and the heat treating chamber, the transfer chamber provided with a transfer robot configured to transfer the substrate to each of the liquid treating chamber, the heat treating chamber, and the cooling chamber, the cooling chamber is adjacent to the transfer chamber, but is on one side of the transfer chamber perpendicular to a longitudinal direction of the transfer chamber among a plurality of sides of the transfer chamber, and the first transfer mechanism of the buffer module is configured to prevent the substrate in the cooling chamber from being unloaded.

18. The substrate processing apparatus of claim 17, wherein in the transfer chamber, a region adjacent to the buffer module is provided in a closed form, and a region adjacent to the cooling chamber is provided in an open form.

19. The substrate processing apparatus of claim 17, wherein an internal negative pressure of the cooling chamber has a positive pressure relative to an internal negative pressure of the buffer module.

20. A substrate processing apparatus comprising:

an index module;

a buffer module;

a treating module; and an interface module, wherein the index module includes a load port configured to accommodate a container, the container configured to receive a substrate, and an index frame provided with an index robot that is configured to transfer the substrate between the container placed in the load port and the buffer module, the buffer module includes a buffer unit configured to place the substrate thereon, the treating module further includes a cooling chamber configured to cool the substrate loaded from the buffer module, a liquid treating chamber configured to liquid treat the substrate loaded from the cooling chamber, a heat treating chamber configured to heat treat the substrate loaded from the cooling chamber, and a transfer chamber between the liquid treating chamber and the heat treating chamber, the transfer chamber provided with a transfer robot configured to transfer the substrate to each of the liquid treating chamber, the heat treating chamber, and the cooling chamber, the cooling chamber includes a cooling plate configured to support the substrate, and a first housing including a space to accommodate the cooling plate therein, the buffer module includes the buffer unit, a second housing configured to accommodate the buffer unit, and a transfer mechanism accommodated in the first-second housing and configured to transfer the substrate from the buffer unit to the cooling chamber, the cooling chamber is adjacent to each of the buffer module and the transfer chamber, the cooling chamber being on one side of the transfer chamber perpendicular to a longitudinal direction of the transfer chamber among a plurality of sides of the transfer chamber, and the transfer mechanism of the buffer module is configured to load the substrate into the cooling chamber, and the transfer robot of the transfer chamber is configured to load the substrate loaded into the cooling chamber into the liquid treating chamber or the heat treating chamber, and the transfer mechanism of the buffer module is configured to prevent the substrate in the cooling chamber from being unloaded.

* * * * *